United States Patent
Zhang et al.

(10) Patent No.: US 12,237,347 B2
(45) Date of Patent: Feb. 25, 2025

(54) IMAGE SENSOR, LAYOUT STRUCTURE, AND CONTROL METHOD

(71) Applicant: SMARTSENS TECHNOLOGY(HK) CO., LIMITED, HK (CN)

(72) Inventors: Shengxin Zhang, Shanghai (CN); Chen Xu, Shanghai (CN)

(73) Assignee: SMARTSENS TECHNOLOGY(HK) CO., LIMITED, Kowloon (CN)

( * ) Notice: Subject to any disclaimer, the term of this patent is extended or adjusted under 35 U.S.C. 154(b) by 74 days.

(21) Appl. No.: 18/084,506

(22) Filed: Dec. 19, 2022

(65) Prior Publication Data

US 2024/0113139 A1  Apr. 4, 2024

(30) Foreign Application Priority Data

Sep. 30, 2022 (CN) .......................... 202211208867.7
Sep. 30, 2022 (CN) .......................... 202222607325.9

(51) Int. Cl.
*H01L 27/146* (2006.01)
*H04N 25/77* (2023.01)
*H04N 25/78* (2023.01)

(52) U.S. Cl.
CPC ....... *H01L 27/14603* (2013.01); *H04N 25/77* (2023.01); *H04N 25/78* (2023.01)

(58) Field of Classification Search
CPC ........ H01L 27/14603; H01L 27/14641; H04N 25/77; H04N 25/78; H04N 25/42; H04N 25/46; H04N 25/59; H04N 25/778
See application file for complete search history.

(56) References Cited

U.S. PATENT DOCUMENTS

2022/0359620 A1* 11/2022 Nishio .................... H01L 25/07

* cited by examiner

*Primary Examiner* — Yogesh K Aggarwal
(74) *Attorney, Agent, or Firm* — IPRTOP LLC

(57) ABSTRACT

An image sensor, a layout structure, and a control method are provided. The image sensor includes multiple pixel blocks arranged in rows and columns. Each pixel block includes: at least one photosensitive unit connected between a floating diffusion active region and a first reference voltage; a reset transistor with a control terminal and a second terminal; a gain control transistor with a control terminal, a first terminal, and a second terminal; a source follower transistor with a control terminal and a second terminal; a select transistor with a control terminal, a first terminal, and a second terminal. Two adjacent pixel blocks in the same column share the same select transistor and the same reset transistor, or two groups each composed of two adjacent pixel blocks in three adjacent pixel blocks in the same column share the same select transistor and the same reset transistor, respectively.

26 Claims, 12 Drawing Sheets

HCG mode

DCG mode

TCG mode

HCG mode

DCG mode

TCG mode

TCG mode+accelerated readout speed

IMAGE SENSOR, LAYOUT STRUCTURE, AND CONTROL METHOD

CROSS REFERENCE TO RELATED APPLICATIONS

The present application claims the benefit of priority to a Chinese Patent Application No. CN202211208867.7, entitled "Image Sensor, Layout Structure, and Control Method", filed with CNIPA on Sep. 30, 2022, and a Chinese Patent Application No. CN 202222607325.9, entitled "Image Sensor and Layout Structure", filed with CNIPA on Sep. 30, 2022, the contents of which are incorporated herein by reference in their entireties.

TECHNICAL FIELD

The present disclosure relates to the technical field of image sensors, in particular, to an image sensor, a layout structure and a control method.

BACKGROUND

Image sensors have been widely used in digital cameras, cell phones, medical devices, automobiles and other applications, and the rapid development of the technology for manufacturing complementary-metal-oxide semiconductor (CMOS) image sensors has led to higher requirements for the output image quality of image sensors.

As resolution of image sensors continue to hike, for example, image sensors with 48 MP, 64 MP, 108 MP, and 200 MP have emerged in recent years, making it necessary to continuously shrink the pixels. For products with pixel sizes bigger than 1.0 µm, the traditional 4T pixel structure can meet the application requirements of the products. However, as the miniaturization continues, it is difficult to add multi-gain functions to the traditional pixel arrangement, which limits the High Dynamic Range (HDR) performance of image sensors.

SUMMARY

The present disclosure provides an image sensor, a layout structure, and a control method.

The image sensor includes: multiple pixel blocks arranged in rows and columns. Each of the multiple pixel blocks includes at least one photosensitive unit, a reset transistor, a gain control transistor, a source follower transistor, and a select transistor.

The photosensitive unit is connected between a floating diffusion active region and a first reference voltage. A control terminal of the reset transistor is connected to a reset control signal, and a second terminal of the reset transistor is connected to a reset voltage. A control terminal of the gain control transistor is connected to a gain control signal, a first terminal of the gain control transistor is connected to the floating diffusion active region, and a second terminal of the gain control transistor is connected to a first terminal of the reset transistor. A control terminal of the source follower transistor is connected to the floating diffusion active region, and a second terminal of the source follower transistor is connected to a following voltage. A control terminal of the select transistor is connected to a select control signal, a first terminal of the select transistor outputs a pixel signal, and a second terminal of the select transistor is connected to a first terminal of the source follower transistor.

Two adjacent pixel blocks in the same column share the same select transistor and the same reset transistor, or two groups each composed of two adjacent pixel blocks in three adjacent pixel blocks in the same column share the same select transistor and the same reset transistor, respectively.

Optionally, the $a^{th}$ pixel block and the $(a+1)^{th}$ pixel block in the same column share the same select transistor, and the $a^{th}$ pixel block and the $(a+1)^{th}$ pixel block in the same column share the same reset transistor; or the $a^{th}$ pixel block and the $(a+1)^{th}$ pixel block in the same column share the same select transistor, and the $(a+1)^{th}$ pixel block and the $(a+2)^{th}$ pixel block in the same column share the same reset transistor; or the $a^{th}$ pixel block and the $(a+1)^{th}$ pixel block in the same column share the same reset transistor, and the $(a+1)^{th}$ pixel block and the $(a+2)^{th}$ pixel block in the same column share the same select transistor; a is an integer greater than or equal to 1.

Optionally, the photosensitive unit includes at least one photosensitive element and at least one transmission transistor; a first terminal of the photosensitive element is connected to a first terminal of the transmission transistor, and a second terminal of the photosensitive element is connected to the first reference voltage; and a control terminal of the transmission transistor is connected to a transmission control signal, and a second terminal of the transmission transistor is connected to the floating diffusion active region.

Optionally, each pixel block includes one said photosensitive unit, and each said photosensitive unit includes four said photosensitive elements and four said transmission transistors corresponding to the photosensitive elements.

Optionally, each of the multiple pixel blocks further includes a capacitor, a first terminal of the capacitor is connected to the second terminal of the gain control transistor, and a second terminal of the capacitor is connected to a second reference voltage.

Optionally, the first terminals of the select transistors in the same column are connected to the same or different column lines to achieve serial or parallel output of pixel signals.

The present disclosure further provides a layout structure of the image sensor. The layout structure includes: multiple transmission transistors corresponding to the photosensitive elements in the photosensitive unit, wherein the multiple transmission transistors enclose an enclosed area; the source follower transistor is disposed in the enclosed area; the floating diffusion active region is disposed in the enclosed area and includes a first floating diffusion active area disposed on one side of the source follower transistor and a second floating diffusion active area disposed on the other side of the source follower transistor; the gain control transistor is disposed outside the enclosed area and on a side of the first floating diffusion active area; the reset transistor and the select transistor are disposed outside the enclosed area and are separated by one of the adjacent source follower transistors.

Optionally, the photosensitive unit includes four photosensitive elements and corresponding four transmission transistors, the four photosensitive elements are arranged in an array, and the four transmission transistors each are in a strip shape and disposed at a corner of one of the four photosensitive elements to enclose the enclosed area.

Optionally, the first floating diffusion active area FD1 is formed between two adjacent transmission transistors 112 that are aligned in a vertical direction, and the second floating diffusion active area FD2 is also formed between two adjacent transmission transistors 112 that are aligned in the vertical direction; the source follower transistor is disposed on a line connecting centers of the first floating diffusion active area and the second floating diffusion active area; and/or, in two adjacent pixel blocks sharing the same select transistor and the same reset transistor, the select transistor is located between the two adjacent source follower transistors and the reset transistor is located outside the two adjacent source follower transistors.

The present disclosure further provides a layout structure of the image sensor. The layout structure includes: multiple transmission transistors corresponding to the photosensitive elements in the photosensitive unit, the multiple transmission transistors enclose an enclosed area; the floating diffusion active region is disposed in the enclosed area; the source follower transistor is disposed outside the enclosed area and on a top of the floating diffusion active region; the gain control transistor is disposed outside the enclosed area and on a side where the source follower transistor is located; the reset transistor and the select transistor are disposed outside the enclosed area and are arranged on two opposite sides of the enclosed area, the gain control transistor is arranged between the reset transistor and its corresponding source follower transistor.

Optionally, the photosensitive unit includes four photosensitive elements and corresponding four transmission transistors, the four photosensitive elements are arranged in an array, and the four transmission transistors are disposed at four adjacent corners of the four photosensitive elements, the four transmission transistors each have a triangle shape and the four triangular shapes are arranged to form the enclosed area.

The present disclosure further provides a control method of the image sensor. The control method includes: controlling on and off of gain control transistors in two adjacent pixel blocks to control a capacitance of a charge storage area connected to a corresponding floating diffusion active region, so that the image sensor enters a different gain mode; wherein the two adjacent pixel blocks are located in the same column and share a same reset transistor.

Optionally, the $a^{th}$ pixel block and the $(a+1)^{th}$ pixel block in the same column of the image sensor share a same select transistor and a same reset transistor, a row in which the $a^{th}$ pixel block is located is taken as the $N^{th}$ row, and the control method includes at least one of the following operations based on the control of the following voltage: controlling a gain control transistor in a pixel block in the $N^{th}$ row to be turned off and a source follower transistor in the pixel block in the $N^{th}$ row to be turned on, and controlling a source follower transistor in a pixel block in the $(N+1)^{th}$ row to be turned off, such that the image sensor enters a first gain mode; controlling the gain control transistor and the source follower transistor in the pixel block in the $N^{th}$ row to be turned on and the reset transistor in the pixel block in the $N^{th}$ row to be turned off, and controlling the gain control transistor and the source follower transistor in the pixel block in the $(N+1)^{th}$ row to be turned off, such that the image sensor enters a second gain mode; and controlling the gain control transistor and the source follower transistor in the pixel block in the $N^{th}$ row to be turned on and the reset transistor in the pixel block in the $N^{th}$ row to be turned off, and controlling the gain control transistor in the pixel block in the $(N+1)^{th}$ row to be turned on and the source follower transistor in the pixel block in the $(N+1)^{th}$ row to be turned off, such that the image sensor enters a third gain mode.

Optionally, the control method further includes: controlling the gain control transistor in the pixel block in the $(N+1)^{th}$ row to be turned on in the first gain mode; and/or controlling the reset transistor in the pixel block in the $N^{th}$ row to be turned off in the first gain mode; and/or controlling the source follower transistor in the pixel block in the $N^{th}$ row and the source follower transistor in the pixel block in the $(N+1)^{th}$ row which share the reset transistor to be turned on when the image sensor enters the third gain mode, to increase a readout speed.

Optionally, the $a^{th}$ pixel block and the $(a+1)^{th}$ pixel block in the same column of the image sensor share the same select transistor, and the $(a+1)^{th}$ pixel block and the $(a+2)^{th}$ pixel block in the same column share the same reset transistor; or the $a^{th}$ pixel block and the $(a+1)^{th}$ pixel block in the same column share the same reset transistor, and the $(a+1)^{th}$ pixel block and the $(a+2)^{th}$ pixel block in the same column share the same select transistor; a row in which the first of the two adjacent pixel blocks sharing the reset transistor is located is taken as the $N^{th}$ row, and the control method includes at least one of the following operations based on the control of the reset voltage: controlling a gain control transistor in a pixel block in the $N^{th}$ row to be turned off, such that the image sensor enters a first gain mode; controlling the reset transistor in the pixel block in the $N^{th}$ row to be turned off and the gain control transistor in the pixel block in the $N^{th}$ row to be turned on, and controlling a gain control transistor in a pixel block in the $(N+1)^{th}$ row to be turned off, such that the image sensor enters a second gain mode; and controlling the reset transistor in the pixel block in the $N^{th}$ row to be turned off and the gain control transistor in the pixel block in the $N^{th}$ row to be turned on, and controlling the gain control transistor in the pixel block in the $(N+1)^{th}$ row to be turned on, such that the image sensor enters a third gain mode.

Optionally, the control method further includes: controlling the reset transistor in the pixel block in the $N^{th}$ row to be turned off and the gain control transistor in the pixel block in the $(N+1)^{th}$ row to be turned on in the first gain mode; and/or controlling a source follower transistor in the pixel block in the $(N+1)^{th}$ row to be turned off in the second gain mode; and/or controlling the source follower transistor in the pixel block in the $(N+1)^{th}$ row to be turned off in the third gain mode; and/or controlling the select transistor in the pixel block in the $N^{th}$ row and the select transistor in the pixel block in the $(N+1)^{th}$ row which share the reset transistor to be turned on when the image sensor enters the third gain mode, to increase a readout speed.

Optionally, the control method further includes: controlling a reset voltage of a second terminal of the reset transistor to be at a high level when the image sensor enters a different gain mode based on the control of the following voltage; and/or, controlling the following voltage of a second terminal of the source follower transistor to be at a high level when the image sensor enters a different gain mode based on the control of a reset voltage.

In summary, the present disclosure provides an image sensor, a layout structure, and a control method. The present disclosure realizes a multi-gain function of the image sensor by making two adjacent pixel blocks share the same reset transistor and/or select transistor. The gain modes of the image sensor include an HCG mode, a DCG mode, and a TCG mode, thereby greatly improving the dynamic range of the image sensor. In addition, the image sensor and its layout design of the present disclosure can achieve multiple gain functions based on fewer transistors, and can address the need for double conversion gain or three conversion gains for shrinking pixels by sharing gain nodes of different rows. The layout structure of the image sensor of the present disclosure is symmetrical, and the interconnecting metal

REFERENCE NUMERALS

100 Pixel Block
110 Photosensitive Unit
111 Photosensitive Element
112 Transmission Transistor
120 Reset Transistor
130 gain control transistor
140 Source Follower Transistor
150 Select Transistor

DETAILED DESCRIPTION

The embodiments of the present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure.

Please refer to FIGS. 1-21. It needs to be stated that the drawings provided in the following embodiments are just used for schematically describing the basic concept of the present disclosure, thus only illustrating components related to the present disclosure and are not necessarily drawn according to the numbers, shapes and sizes of components during actual implementation, the configuration, number and scale of each component during actual implementation thereof may be freely changed, and the component layout configuration thereof may be more complex.

Figure 1:
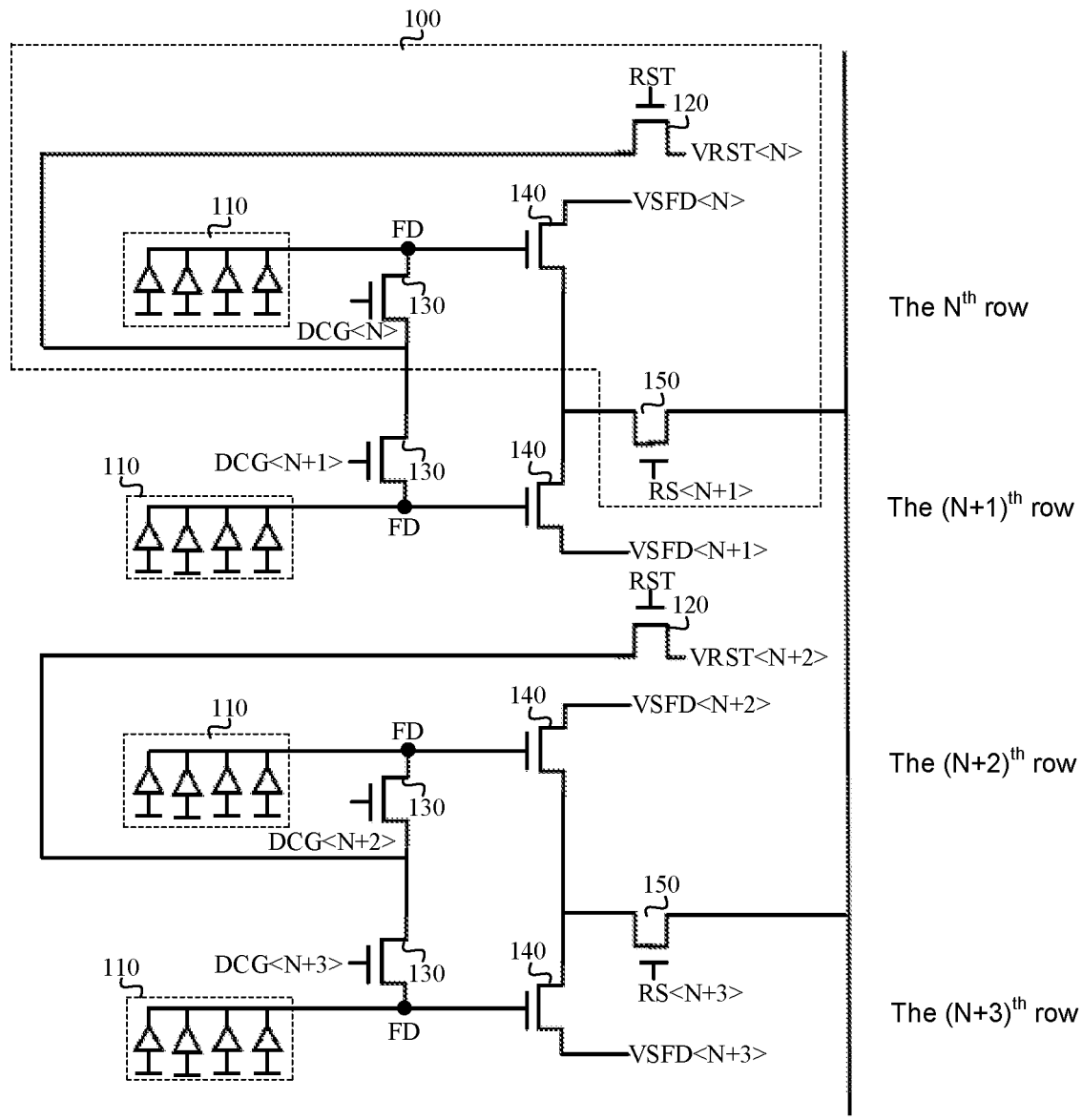
FIG. 1 shows a first circuit diagram of an image sensor of the present disclosure.
Figure 8:
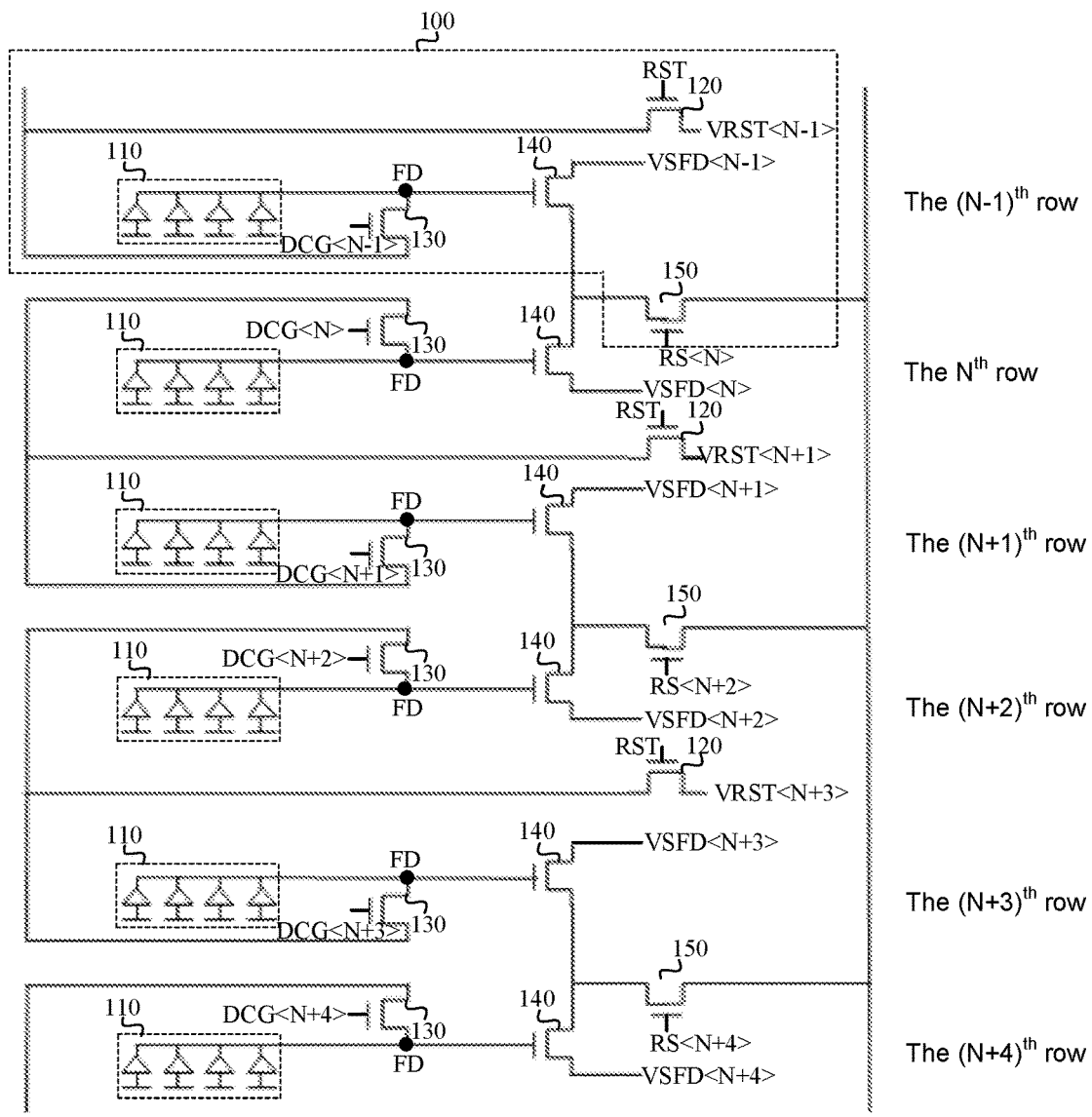
FIG. 8 shows a second circuit diagram of an image sensor of the present disclosure.
Figure 15:
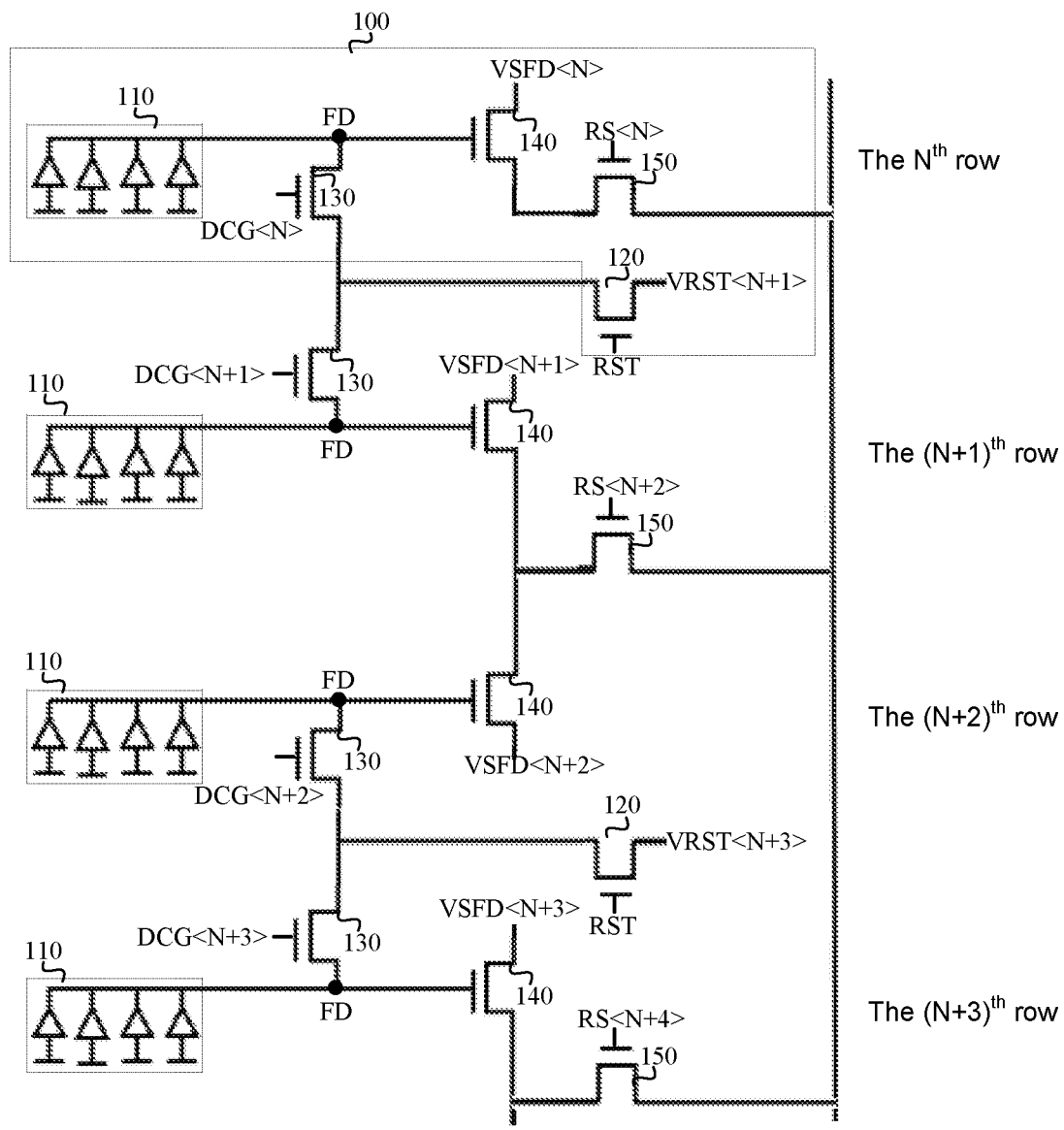
FIG. 15 shows a third circuit diagram of an image sensor of the present disclosure.

As shown in FIGS. 1, 8 and 15, the present disclosure provides an image sensor which includes multiple pixel blocks 100 arranged in rows and columns. Each of the pixel blocks 100 includes: at least one photosensitive unit 110, a reset transistor 120, a gain control transistor 130, a source follower transistor 140 and a select transistor 150.

The photosensitive unit 110 is connected between a floating diffusion active region FD and a first reference voltage to generate an exposure charge according to the photoelectric effect, and transfer and output the exposure charge.

Specifically, the number of the photosensitive unit 110 can be designed according to the actual needs. Each photosensitive unit 110 includes at least one photosensitive element 111 and a transmission transistor 112 corresponding to the photosensitive element 111. A first terminal of the photosensitive element 111 is connected to a first terminal of the transmission transistor 112, and a second terminal of the photosensitive element 111 is connected to the first reference voltage. A control terminal of the transmission transistor is connected to a transmission control signal TX, and a second terminal of the transmission transistor 112 is connected to the floating diffusion active region FD. The number of the photosensitive element 111 and the corresponding transmission transistor 112 in each photosensitive unit 110 can be set according to the actual needs, for example, 4, 8, etc. In some embodiments, the transmission transistor 112 may correspond to the photosensitive element 111 in other ways, which are not limited to this.

As an example, each photosensitive unit 110 includes four photosensitive elements 111 and four transmission transistors 112 corresponding to the photosensitive elements 111, and each pixel block 100 includes one photosensitive unit 110.

Figure 21:
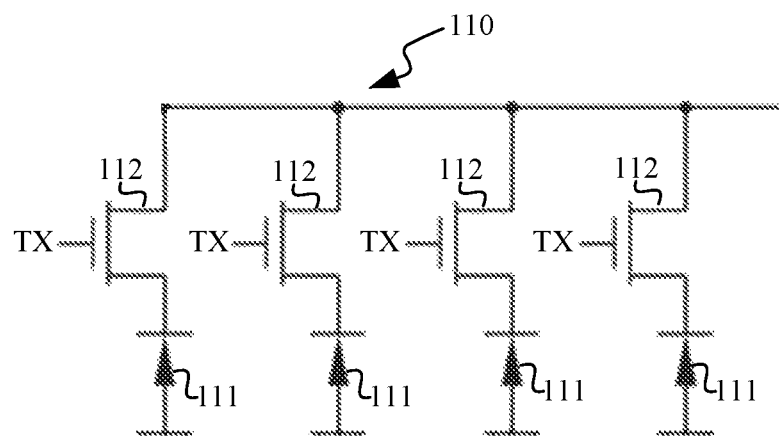
FIG. 21 shows a circuit diagram of a photosensitive unit of the present disclosure.

As an example, the photosensitive element 111 is a photodiode, the transmission transistor 112 is an NMOS transistor, and the first reference voltage is the reference ground. An anode terminal of the photodiode is connected to the reference ground, a cathode terminal of the photodiode is connected to a source terminal of the NMOS transistor, a gate terminal of the NMOS transistor is connected to the transmission control signal TX, and a drain terminal of the NMOS transistor is connected to the floating diffusion active region FD, as shown in FIG. 21.

A control terminal of the reset transistor 120 is connected to a reset control signal RST, a first terminal of the reset transistor 120 is connected to a second terminal of the gain control transistor 130, and a second terminal of the reset transistor 120 is connected to a reset voltage VRST to reset the voltage of the floating diffusion active region FD according to the reset voltage VRST and the reset control signal RST and to complete the reset of the photosensitive element 111 (such as photodiode) and other operations.

As an example, the reset transistor 120 is an NMOS transistor, a gate terminal of the NMOS transistor is connected to the reset control signal RST, a source terminal of the NMOS transistor is connected to the second terminal of the gain control transistor 130, and a drain terminal of the NMOS transistor is connected to the reset voltage VRST.

A control terminal of the gain control transistor 130 is connected to a gain control signal DCG, a first terminal of the gain control transistor 130 is connected to the floating diffusion active region FD, and a second terminal of the gain control transistor 130 is connected to the first terminal of the reset transistor 120 to adjust the capacitance of the floating diffusion active region FD and to make the image sensor work in different gain modes.

As an example, a parasitic capacitance of a connection point between the reset transistor 120 and the gain control transistor 130 to ground is used as a regulating capacitance. In other embodiments, a device capacitor (not shown in the drawings) may be set as a regulating capacitor in the pixel block 100, in which case, the pixel block 100 includes a capacitor, i.e., the regulating capacitor. A first terminal of the capacitor is connected to the second terminal of the gain control transistor 130, and a second terminal of the gain capacitor is connected to a second reference voltage.

As an example, the gain control transistor 130 is an NMOS transistor, a gate terminal of the NMOS transistor is connected to the gain control signal DCG, a source terminal of the NMOS transistor is connected to the floating diffusion active region FD, and a drain terminal of the NMOS transistor is connected to the first terminal of the reset transistor 120. In addition, when the pixel block 100 includes the capacitor, as an example, the second reference voltage is the reference ground, and the drain terminal of the NMOS transistor is connected to the reference ground through the capacitor.

A control terminal of the source follower transistor 140 is connected to the floating diffusion active region FD, a first terminal of the source follower transistor 140 is connected to a second terminal of the select transistor 150, and a second terminal of the source follower transistor 140 is connected to a following voltage VFSD to sample pixel signals, etc., according to the following voltage VFSD.

As an example, the source follower transistor 140 is an NMOS transistor, a gate terminal of the NMOS transistor is connected to the floating diffusion active region FD, a source terminal of the NMOS transistor is connected to the second terminal of the select transistor 150, and a drain terminal of the NMOS transistor is connected to the following voltage VFSD.

A control terminal of the select transistor 150 is connected to a select control signal RS, a first terminal of the select transistor 150 outputs a pixel signal, and a second terminal of the select transistor 150 is connected to the first terminal of the source follower transistor 140 to output the pixel signal.

As an example, the select transistor 150 is an NMOS transistor, a gate terminal of the NMOS transistor is connected to the select control signal RS, a source terminal of the NMOS transistor outputs a pixel signal, and a drain terminal of the NMOS transistor is connected to the first terminal of the source follower transistor 140.

In the image sensor of this embodiment, the reset transistor 120 and/or the select transistor 150 are shared by two adjacent pixel blocks 100 in the same column to achieve the multi-gain function. For example, two adjacent pixel blocks 100 in the same column share the same select transistor 150 and the same reset transistor 120, or, two groups each consisting of two adjacent pixel blocks 100 of three adjacent pixel blocks 100 share the same select transistor 150 and the same reset transistor 120, respectively.

In a first embodiment of the image sensor, as shown in FIG. 1, the $a^{th}$ pixel block 100 and the $(a+1)^{th}$ pixel block 100 in the same column share a same reset transistor 120, and the $a^{th}$ pixel block 100 and the $(a+1)^{th}$ pixel block 100 in the same column share a same select transistor 150, where a is an integer greater than or equal to 1.

In the first embodiment of the image sensor, the first pixel block 100 and the second pixel block 100 may share a same reset transistor 120 and a same select transistor 150, the third pixel block 100 and the fourth pixel block 100 may share a same reset transistor 120 and a same select transistor 150, and the fifth pixel block 100 and the sixth pixel block 100 may share a same reset transistor 120 and a same select transistor 150, and so forth.

The first pixel block 100 may also exclusively use a reset transistor 120 and a select transistor 150, the second pixel block 100 and the third pixel block 100 may share a same reset transistor 120 and a same select transistor 150, the fourth pixel block 100 and the fifth pixel block 100 may share a same reset transistor 120 and a same select transistor 150, and the sixth pixel block 100 and the seventh pixel block 100 may share a same reset transistor 120 and a same select transistor 150, and so forth.

The feasible solutions are not limited to the above two, in fact, as long as at least one set of two adjacent pixel blocks 100 in the same column of the image sensor share a same reset transistor 120 and a same select transistor 150, it shall fall within the scope of the embodiments of the present disclosure.

In a second embodiment of the image sensor, as shown in FIG. 8, the $(a+1)^{th}$ pixel block 100 and the $(a+2)^{th}$ pixel block 100 in the same column share a same reset transistor 120, and the $a^{th}$ pixel block 100 and the $(a+1)^{th}$ pixel block 100 in the same column share a same select transistor 150, where a is an integer greater than or equal to 1.

In some examples, the first pixel block 100 may exclusively use a reset transistor 120, the first pixel block 100 and the second pixel block 100 may share a same select transistor 150, the second pixel block 100 and the third pixel block 100 may share a same reset transistor 120, the third pixel block 100 and the fourth pixel block 100 may share a same select transistor 150, the fourth pixel block 100 and the fifth pixel block 100 may share a same reset transistor 120, and the fifth pixel block 100 and the sixth pixel block 100 may share a same select transistor 150, and so forth.

In some examples, the first pixel block 100 may exclusively use a reset transistor 120 and a select transistor 150, the second pixel block 100 may exclusively use a reset transistor 120, the second pixel block 100 and the third pixel block 100 may share a same select transistor 150, the third pixel block 100 and the fourth pixel block 100 may share a same reset transistor 120, the fourth pixel block 100 and the fifth pixel block 100 may share a same select transistor 150, the fifth pixel block 100 and the sixth pixel block 100 may share a same reset transistor 120, and the sixth pixel block 100 and the seventh pixel block 100 may share a same select transistor 150, and so forth.

The feasible solutions are not limited to the above two embodiments; in fact, as long as there is at least one set of three adjacent pixel blocks 100 in the same column of the image sensor, where the first two pixel blocks 100 share a same select transistor 150 and the last two pixel blocks 100 share a same reset transistor 120, it shall fall within the scope of the embodiments of the present disclosure.

In an example, as shown in FIG. 15, the $a^{th}$ pixel block 100 and the $(a+1)^{th}$ pixel block 100 in the same column share a same reset transistor 120, and the $(a+1)^{th}$ pixel block 100 and the $(a+2)^{th}$ pixel block 100 in the same column share a same select transistor 150, where a is an integer greater than or equal to 1.

In some examples, the first pixel block 100 and the second pixel block 100 may share a reset transistor 120, the first pixel block 100 may exclusively use a select transistor 150, the second pixel block 100 and the third pixel block 100 may share a same select transistor 150, the third pixel block 100 and the fourth pixel block 100 may share a same reset transistor 120, the fourth pixel block 100 and the fifth pixel block 100 may share a same select transistor 150, the fifth pixel block 100 and the sixth pixel block 100 may share a same reset transistor 120, and so forth.

In some examples, the first pixel block 100 may exclusively use a reset transistor 120 and a select transistor 150, the second pixel block 100 and the third pixel block 100 may share a same reset transistor 120, the third pixel block 100 and the fourth pixel block 100 may share a same select transistor 150, the fourth pixel block 100 and the fifth pixel block 100 may share a same reset transistor 120, the fifth pixel block 100 and the sixth pixel block 100 may share a same select transistor 150, and the sixth pixel block 100 and the seventh pixel block 100 may share a same reset transistor 120, and so forth.

The feasible solutions are not limited to the above two, in fact, as long as there is at least one set of three adjacent pixel blocks 100 in the same column of the image sensor, where the first two pixel blocks 100 share a same reset transistor 120 and the last two pixel blocks 100 share a same select transistor 150, it shall fall within the scope of the embodiments of the present disclosure.

In each of the above examples, the first terminals of the select transistors 150 in the same column are connected to the same or different column lines to achieve serial or parallel output of pixel signals. For example, the first terminals of the select transistors 150 in the same column may be connected to the same column line to achieve serial output of pixel signals; or the first terminals of the select transistors 150 in the same column may be connected to different column lines to achieve parallel output of pixel signals. In practice, parallel output and serial output can be selected according to specific needs. In an example, the same column is a column corresponding to a pixel block 100, and in a further example, the pixel block 100 includes a photosensitive unit 110, and the photosensitive unit 110 includes four photosensitive elements 111, i.e., in this example, the four photosensitive elements 111 correspond to the same column as described. In another example, the same row is a row corresponding to a pixel block 100, and in a further example, the pixel block 100 includes a photosensitive unit 110, and the photosensitive unit 110 includes four photosensitive elements 111, i.e., in this example, the four photosensitive elements 111 correspond to the same row as described.

The present disclosure further provides a control method for an image sensor, and the image sensor is implemented using the circuit structure as described above. The control method enables gain mode control of the image sensor.

The control method includes: controlling the on and off of gain control transistors 130 in two adjacent pixel blocks 100 to control the capacitance value of a capacitor connected to a corresponding floating diffusion active region FD, that is to say, to control a capacitance of charge storage area connected to a corresponding floating diffusion active region FD, so that the image sensor enters a different gain mode; the two adjacent pixel blocks 100 are located in the same column and share a same reset transistor 120.

In a first embodiment of the control method, as shown in FIG. 1, the $a^{th}$ pixel block 100 and the $(a+1)^{th}$ pixel block 100 in the same column of the image sensor share a same reset transistor 120 and a same select transistor 150. In an example, when the image sensor enters a different gain mode based on the control of the following voltage, the reset voltage at a second terminal of the reset transistor 120 is controlled to be at a high level VDD, and the on or off of the reset transistor 120 can be controlled by a reset control signal RST at a control terminal of the reset transistor 120.

[ono] Take the row where the $a^{th}$ pixel block 100 is located as the $N^{th}$ row. The control method includes the following steps.

Figure 4:
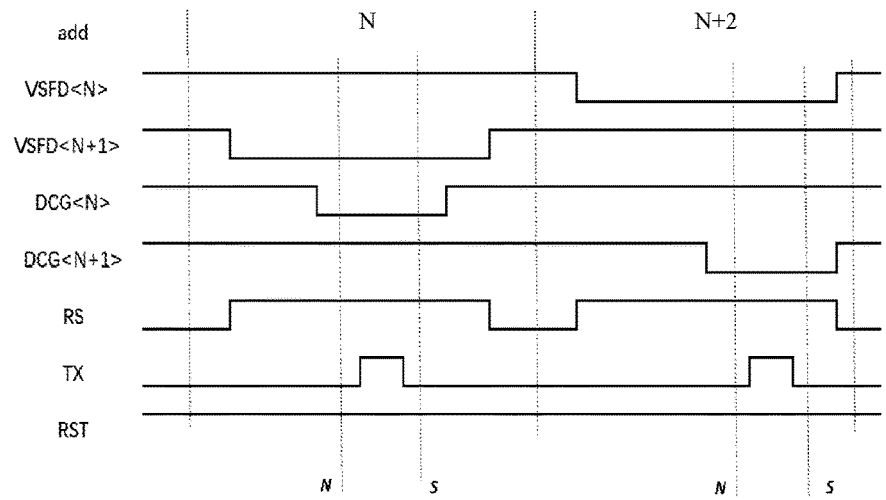
FIG. 4 shows a timing diagram of the image sensor in FIG. 1 in an HCG mode.

Step 1-1: as shown in the timing of address N in FIG. 4, controlling a gain control transistor 130 in a pixel block 100 in the $N^{th}$ row to be turned off (DCG<N> is at a low level) and a source follower transistor 140 in the pixel block 100 in the $N^{th}$ row to be turned on (VSFD<N> is at a high level), and controlling a source follower transistor 140 in a pixel block 100 in the $(N+1)^{th}$ row to be turned off (VSFD<N+1> is at a low level). In a further example, controlling a gain control transistor 130 in the pixel block 100 in the $(N+1)^{th}$ row to be turned on (DCG<N+1> is at a high level) to perform a charge transfer operation on the pixel block 100 in the $N^{th}$ row. The total capacitance used to adjust the gain is the capacitance of the floating diffuse active region FD corresponding to the pixel block 100 in the $N^{th}$ row (i.e., Ctotal=Cfd_n), and the image sensor enters a first gain mode, such as an HCG mode. In an example, as shown in FIG. 4, the operation of timing for pixels at the address of the $(N+2)^{th}$ row is performed at the same time as the operation of timing for pixels at the address of the $N^{th}$ row, so do the other timing diagrams, which will not be described here. In a further example, N and S in FIG. 4 represent sampling the reset signals and image signals respectively to achieve the related sampling.

In this process, four transmission transistors 111 in the pixel block 100 in the $N^{th}$ row are turned off, and the select transistor 150 is turned on. Further, the reset transistor 120 may be controlled to be turned off. When the image sensor enters the first gain mode and the charge transfer operation is performed, the four transmission transistors 111 in the pixel block 100 in the $N^{th}$ row are controlled to be turned on and then be turned off, and the other transistors remain unchanged.

Figure 5:
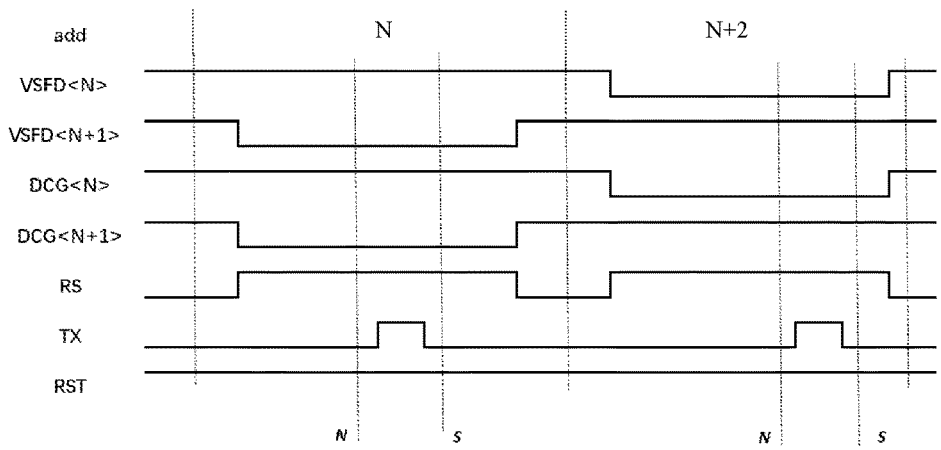
FIG. 5 shows a timing diagram of the image sensor in FIG. 1 in a DCG mode.

Step 1-2: as shown in the timing of address N in FIG. 5, controlling the gain control transistor 130 and the source follower transistor 140 in the pixel block 100 in the $N^{th}$ row to be turned on (DCG<N> is at a high level, VSFD<N> is at a high level) and the reset transistor 120 in the pixel block 100 in the $N^{th}$ row to be turned off, and controlling the gain control transistor 130 in the pixel block 100 in the $(N+1)^{th}$ row to be turned off (DCG<N+1> is at a low level) and the source follower transistor 140 in the pixel block 100 in the $(N+1)^{th}$ row to be turned off (VSFD<N+1> is at a low level) to perform a charge transfer operation on the pixel block 100 in the $N^{th}$ row. The total capacitance used to adjust the gain is the sum of the capacitance of the floating diffuse active area FD corresponding to the pixel block 100 in the $N^{th}$ row and the capacitance of the gain control transistor 130 in the pixel block 100 in the $N^{th}$ row (i.e., Ctotal=Cfd_n+Cdcg_n), and the image sensor enters a second gain mode, such as a DCG mode.

In this process, four transmission transistors 111 in the pixel block 100 in the $N^{th}$ row are turned off, and the select transistor 150 is turned on. When the image sensor enters the second gain mode and the charge transfer operation is performed, the four transmission transistors 111 in the pixel block 100 in the $N^{th}$ row are controlled to be turned on and then be turned off, and the other transistors remain unchanged.

Figure 6:
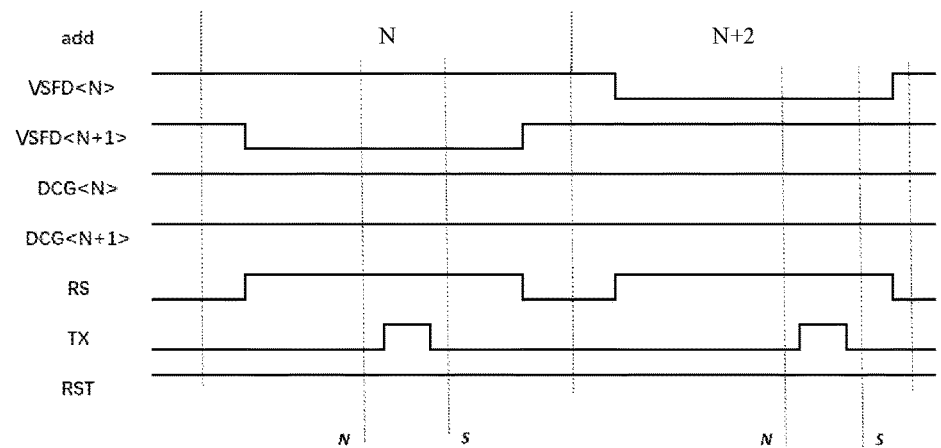
FIG. 6 shows a timing diagram of the image sensor in FIG. 1 in a TCG mode.
Figure 7:
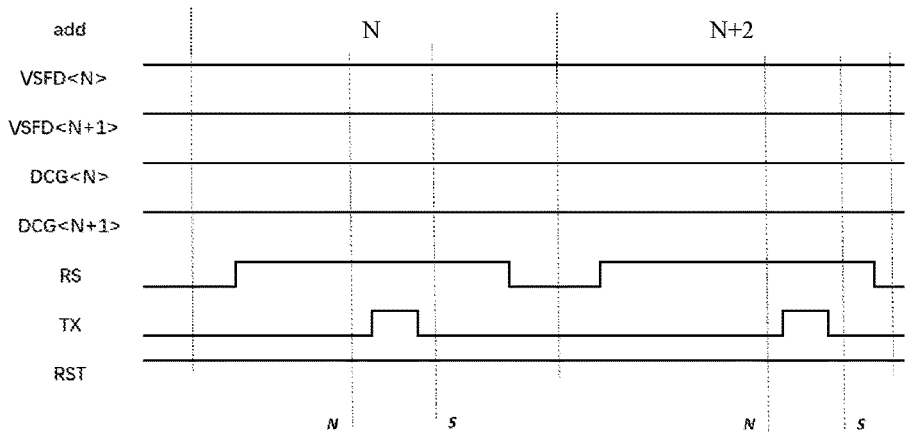
FIG. 7 shows a timing diagram for accelerated readout of the image sensor in FIG. 1 in a TCG mode.

Step 1-3: as shown in the timing of address N in FIG. 6, controlling the gain control transistor 130 and the source follower transistor 140 in the pixel block 100 in the $N^{th}$ row to be turned on (DCG<N> is at a high level, VSFD<N> is at a high level) and the reset transistor 120 in the pixel block 100 in the $N^{th}$ row to be turned off, and controlling the gain control transistor 130 in the pixel block 100 in the $(N+1)^{th}$ row to be turned on and the source follower transistor 140 in the pixel block 100 in the $(N+1)^{th}$ row to be turned off (DCG<N+1> is at a high level, VSFD<N+1> is at a low level) to perform a charge transfer operation on the pixel block 100 in the $N^{th}$ row. The total capacitance used to adjust the gain is the sum of the capacitance of the floating diffuse active area FD corresponding to the pixel block 100 in the $N^{th}$ row, the capacitance of the gain control transistor 130 in the pixel block 100 in the $N^{th}$ row, the capacitance of the gain control transistor 130 in the pixel block 100 in the $(N+1)^{th}$ row, and the capacitance of the floating diffuse active area FD corresponding to the pixel block 100 in the $(N+1)^{th}$ row (i.e. Ctotal=Cfd_n+Cdcg_n+Cdcg_n+1+Cfd_n+1), and the image sensor enters a third gain mode, such as a TCG mode.

In this process, four transmission transistors 111 in the pixel block 100 in the $N^{th}$ row are turned off, and the select transistor 150 is turned on. When the image sensor enters the third gain mode and the charge transfer operation is performed, the four transmission transistors 111 in the pixel block 100 in the $N^{th}$ row are controlled to be turned on and then be turned off, and the other transistors remain unchanged.

It should be noted that for the above three control steps, i.e., steps 1-1, 1-2, and 1-3, those skilled in the art can change the order according to the actual demand, and one or two or more of these modes can be selected for control reading according to the actual demand. In an example, no matter what gain mode the image sensor is in, the source follower transistor 140 in the pixel block 100 in the $N^{th}$ row needs to be turned on when the charge is read out for the pixel block 100 in the $N^{th}$ row, where the pixel block 100 in the $N^{th}$ row shares a reset transistor 120 with the pixel block 100 in an adjacent row. In an example, for the third gain mode, the source follower transistor 140 in the pixel block 100 in the $N^{th}$ row and the source follower transistor 140 in the pixel block 100 in the $(N+1)^{th}$ row which share the reset transistor 120 may be turned on simultaneously (VSFD<N> and VSFD<N+1> are at high levels) when the charge is read out for the pixel block 100 in the $N^{th}$ row, to increase the readout speed, as shown in the timing of address N in FIG. 7.

In a second embodiment of the control method, as shown in FIG. 8, the $a^{th}$ pixel block 100 and the $(a+1)^{th}$ pixel block 100 in the same column of the image sensor share the same select transistor 150, and the $(a+1)^{th}$ pixel block 100 and the $(a+2)^{th}$ pixel block 100 in the same column share the same reset transistor 120. In an example where the image sensor enters a different gain mode based on the control of the reset voltage, a following voltage at a second terminal of the source follower transistor 140 may be controlled to be at a high level and be turned on.

Take the row where the $(a+1)^{th}$ pixel block 100 is located as the $N^{th}$ row. The control method includes the following steps.

Figure 11:
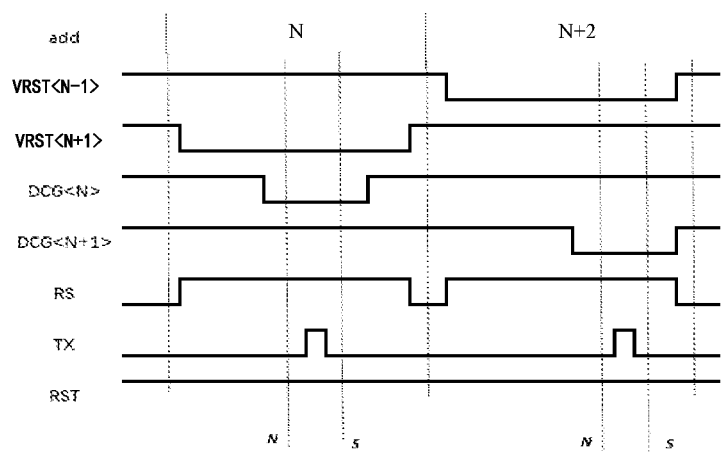
FIG. 11 shows a timing diagram of the image sensor in FIG. 8 in an HCG mode.

Step 2-1: as shown in the timing of address N in FIG. 11, controlling the gain control transistor 130 in the pixel block 100 in the $N^{th}$ row to be turned off (DCG<N> is at a low level). In a further example, controlling the gain control transistor 130 in the pixel block 100 in the $(N+1)^{th}$ row to be turned on (DCG<N+1> is at a high level) to perform a charge transfer operation on the pixel block 100 in the $N^{th}$ row. The total capacitance used to adjust the gain is the capacitance of the floating diffuse active area FD corresponding to the pixel block 100 in the $N^{th}$ row (i.e., Ctotal=Cfd_n), and the image sensor enters a first gain mode, such as an HCG mode.

In this process, four transmission transistors 111 in the pixel block 100 in the $N^{th}$ row are turned off, the select transistor 150 is turned on (RS<N> is at a high level), and the source follower transistor 140 is turned on (VSFD<N> is at a high level). In an example, the reset transistor 120 in the pixel block 100 in the $N^{th}$ row is turned off (VRST<N+1> is at a low level). When the image sensor enters the first gain mode and the charge transfer operation is performed, the four transmission transistors 111 in the pixel block 100 in the $N^{th}$ row are controlled to be turned on and then be turned off, and the other transistors remain unchanged.

Figure 12:
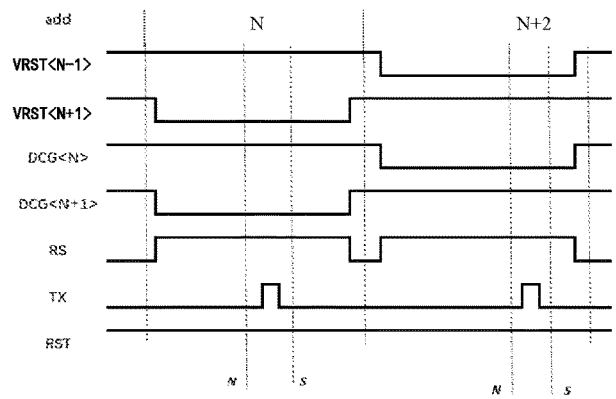
FIG. 12 shows a timing diagram of the image sensor in FIG. 8 in a DCG mode.

Step 2-2: as shown in the timing of address N in FIG. 12, controlling the reset transistor 120 in the pixel block 100 in the $N^{th}$ row to be turned off (VSFD<N+1> is at a low level) and the gain control transistor 130 in the pixel block 100 in the $N^{th}$ row to be turned on (DCG<N> is at a high level), and controlling the gain control transistor 130 in the pixel block 100 in the $(N+1)^{th}$ row to be turned off (DCG<N+1> is at a low level). In a further example, controlling the source follower transistor 140 in the pixel block 100 in the $(N+1)^{th}$ row to be turned off (VSFD<N+1> is at a low level) to perform a charge transfer operation on the pixel block 100 in the $N^{th}$ row. The total capacitance used to adjust the gain is the sum of the capacitance of the floating diffuse active area FD corresponding to the pixel block 100 in the $N^{th}$ row and the capacitance of the gain control transistor 130 in the pixel block 100 in the $N^{th}$ row (i.e., Ctotal=Cfd_n+Cdcg_n), and the image sensor enters a second gain mode, such as a DCG mode.

In this process, four transmission transistors 111 in the pixel block 100 in the $N^{th}$ row are turned off, the select transistor 150 is turned on (RS<N> is at a high level), and the source follower transistor 140 is turned on (VSFD<N> is at a high level). When the image sensor enters the second gain mode and the charge transfer operation is performed, the four transmission transistors 111 in the pixel block 100 in the $N^{th}$ row are controlled to be turned on and then turned off, and the other transistors remain unchanged.

Figure 13:
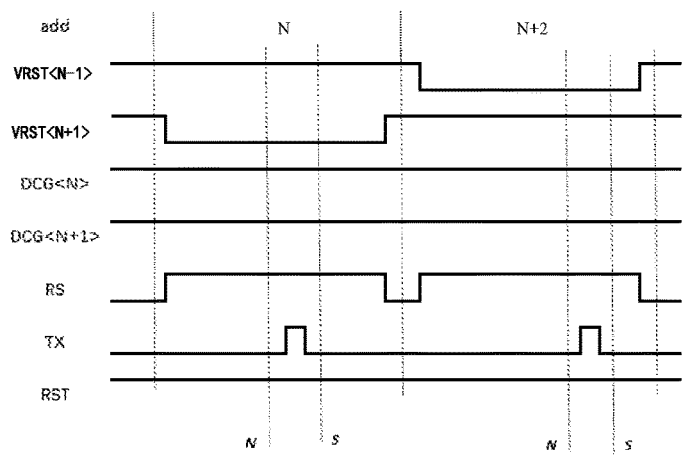
FIG. 13 shows a timing diagram of the image sensor in FIG. 8 in a TCG mode.
Figure 14:
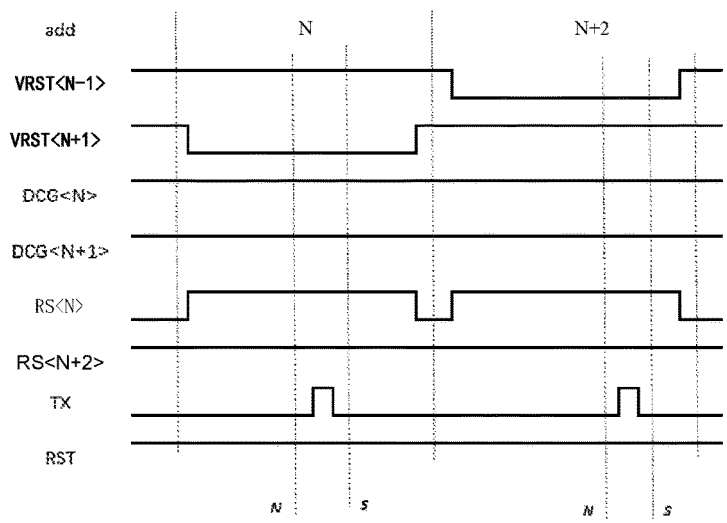
FIG. 14 shows a timing diagram for accelerated readout of the image sensor in FIG. 8 in a TCG mode.

Step 2-3: as shown in the timing of address N in FIG. 13, controlling the reset transistor 120 in the pixel block 100 in the $N^{th}$ row to be turned off (VSFD<N+1> is at a low level) and the gain control transistor 130 in the pixel block 100 in the $N^{th}$ row to be turned on (DCG<N> is at a high level), and controlling the gain control transistor 130 in the pixel block 100 in the $(N+1)^{th}$ row to be turned on (DCG<N+1> is at a high level). In a further example, controlling the source follower transistor 140 in the pixel block 100 in the $(N+1)^{th}$ row to be turned off (VSFD<N+1> is at a low level) to perform a charge transfer operation on the pixel block 100 in the $N^{th}$ row. The total capacitance used to adjust the gain is the sum of the capacitance of the floating diffuse active area FD corresponding to the pixel block 100 in the $N^{th}$ row, the capacitance of the gain control transistor 130 in the pixel block 100 in the $N^{th}$ row, the capacitance of the gain control transistor 130 in the pixel block 100 in the $(N+1)^{th}$ row, and the capacitance of the floating diffuse active area FD corresponding to the pixel block 100 in the $(N+1)^{th}$ row (i.e., Ctotal=Cfd_n+Cdcg_n+Cdcg_n+1+Cfd_n+1), and the image sensor enters a third gain mode, such as a TCG mode.

In this process, four transmission transistors 111 in the pixel block 100 in the $N^{th}$ row are turned off, the select transistor 150 is turned on (RS<N> is at a high level), and the source follower transistor 140 is turned on (VSFD<N> is at a high level). When the image sensor enters the third gain mode and the charge transfer operation is performed, the four transmission transistors 111 in the pixel block 100 in the $N^{th}$ row are controlled to be turned on and then be turned off, and the other transistors remain unchanged.

It should be noted that for the above three control steps, i.e., steps 2-1, 2-2, and 2-3, those skilled in the art can change the order according to the actual demand, and one or two or more of these modes can be selected for control reading according to the actual demand. In an example, no matter what gain mode the image sensor is in, the select transistor 150 in the pixel block 100 in the $N^{th}$ row needs to be turned on when the charge is read out for the pixel block 100 in the $N^{th}$ row, where the pixel block 100 in the $N^{th}$ row shares a reset transistor 120 with the pixel block 100 in an adjacent row. In an example, for the third gain mode, the select transistor 150 in the pixel block 100 in the $N^{th}$ row and the select transistor 150 in the pixel block 100 in the $(N+1)^{th}$ row which share the reset transistor 120 may be turned on simultaneously (RS<N> is at a high level, and RS<N+2> is at a high level) when the charge is read out for the pixel block 100 in the $N^{th}$ row, to increase the readout speed, as shown in the timing of address N in FIG. 14.

In a third embodiment of the control method, as shown in FIG. 15, the $a^{th}$ pixel block 100 and the $(a+1)^{th}$ pixel block 100 in the same column of the image sensor share the same reset transistor 120, and the $(a+1)^{th}$ pixel block 100 and the $(a+2)^{th}$ pixel block 100 in the same column share the same select transistor 150. In an example where the image sensor enters a different gain mode based on the control of the reset voltage, a following voltage at a second terminal of the source follower transistor 140 may be controlled to be at a high level and be turned on.

Take the row where the $a^{th}$ pixel block 100 is located as the $N^{th}$ row. The control method includes the following steps.

Figure 17:
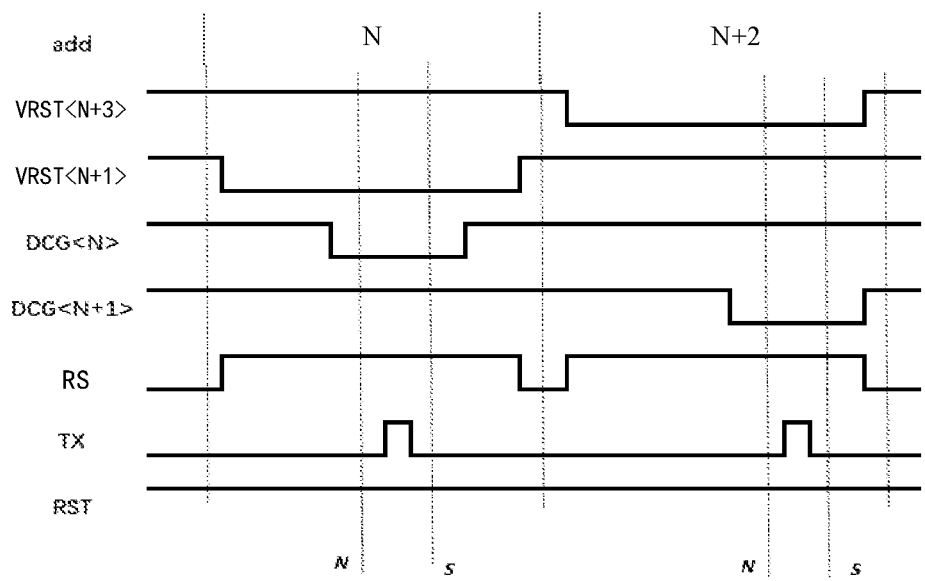
FIG. 17 shows a timing diagram of the image sensor in FIG. 15 in an HCG mode.

Step 3-1: as shown in the timing of address N in FIG. 17, controlling the gain control transistor 130 in the pixel block 100 in the $N^{th}$ row to be turned off (DCG<N> is at a low level). In a further example, controlling the source follower transistor 140 in the pixel block 100 in the $N^{th}$ row to be turned on (VSFD<N> is at a high level). In a further example, controlling the gain control transistor 130 in the pixel block 100 in the $(N+1)^{th}$ row to be turned on (DCG<N+1> is at a high level) and/or the source follower transistor 140 to be turned off (VSFD<N+1> is at a low level) to perform a charge transfer operation on the pixel block 100 in the $N^{th}$ row. The total capacitance used to adjust the gain is the capacitance of the floating diffuse active area FD corresponding to the pixel block 100 in the $N^{th}$ row (i.e., Ctotal=Cfd_n), and the image sensor enters a first gain mode, such as an HCG mode.

In this process, four transmission transistors 111 in the pixel block 100 in the $N^{th}$ row are turned off, and the select transistor 150 is turned on (RS<N> is at a high level). In a further example, the reset transistor 120 in the pixel block 100 in the $N^{th}$ row is turned off (VRST<N+1> is at a low level). When the image sensor enters the first gain mode and the charge transfer operation is performed, the four transmission transistors 111 in the pixel block 100 in the $N^{th}$ row are controlled to be turned on and then be turned off, and the other transistors remain unchanged.

Figure 18:
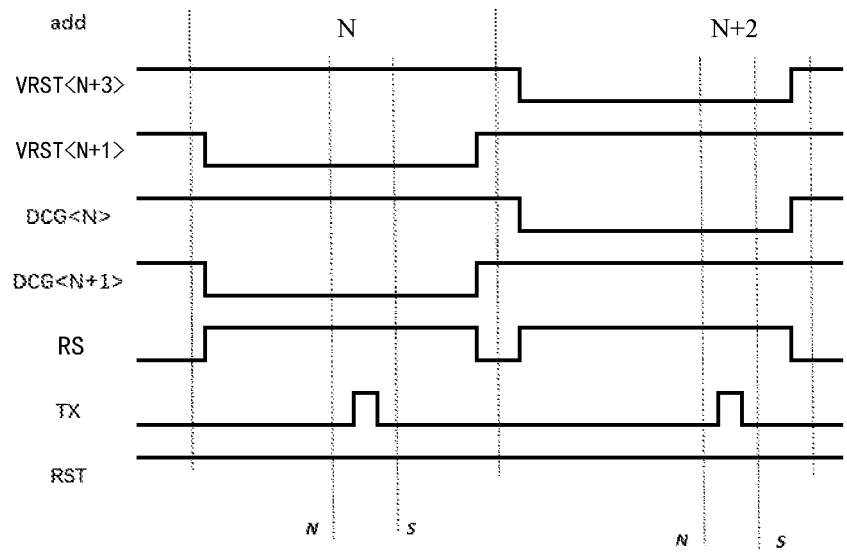
FIG. 18 shows a timing diagram of the image sensor in FIG. 15 in a DCG mode.

Step 3-2: as shown in the timing of address N in FIG. 18, controlling the gain control transistor 130 in the pixel block 100 in the $N^{th}$ row to be turned on (DCG<N> is at a high level) and the reset transistor 120 in the pixel block 100 in the $N^{th}$ row to be turned off (VRST<N+1> is at a low level), and controlling the gain control transistor 130 in the pixel block 100 in the $(N+1)^{th}$ row to be turned off (DCG<N+1> is at a low level). In a further example, controlling the source follower transistor 140 in the pixel block 100 in the $N^{th}$ row to be turned on (VSFD<N> is at a high level) and the source follower transistor 140 in the pixel block 100 in the $(N+1)^{th}$ row to be turned off (VSFD<N+1> is at a low level) to perform a charge transfer operation on the pixel block 100 in the $N^{th}$ row. The total capacitance used to adjust the gain is the sum of the capacitance of the floating diffuse active area FD corresponding to the pixel block 100 in the $N^{th}$ row and the capacitance of the gain control transistor 130 in the pixel block 100 in the $N^{th}$ row (i.e., Ctotal=Cfd_n+Cdcg_n), and the image sensor enters a second gain mode, such as a DCG mode.

In this process, four transmission transistors 111 in the pixel block 100 in the $N^{th}$ row are turned off, and the select transistor 150 is turned on (RS<N> is at a high level). When the image sensor enters the second gain mode and the charge transfer operation is performed, the four transmission transistors 111 in the pixel block 100 in the $N^{th}$ row are controlled to be turned on and then be turned off, and the other transistors remain unchanged.

Figure 19:
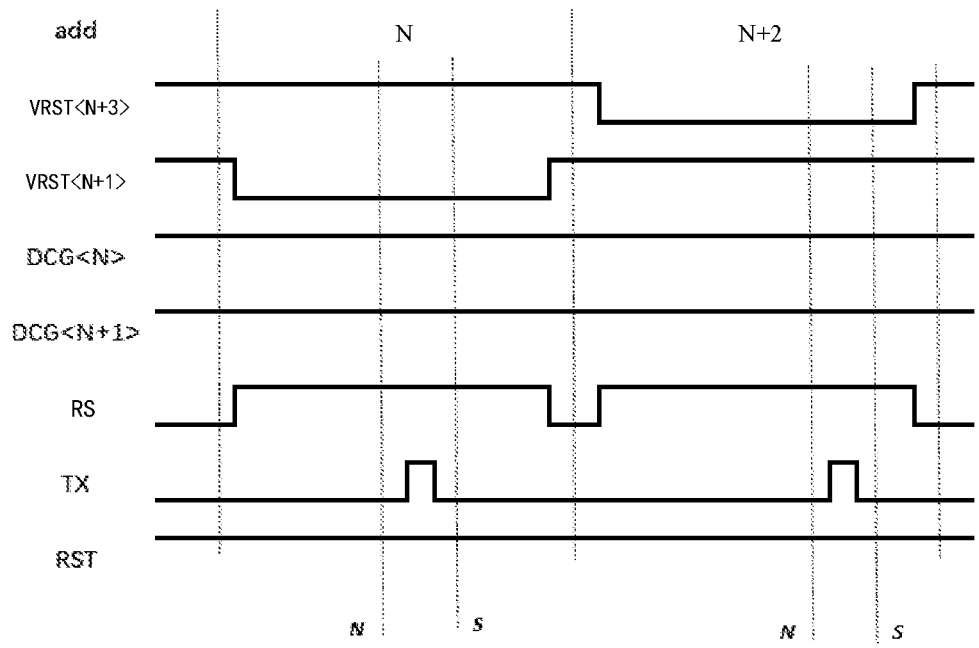
FIG. 19 shows a timing diagram of the image sensor in FIG. 15 in a TCG mode.
Figure 20:
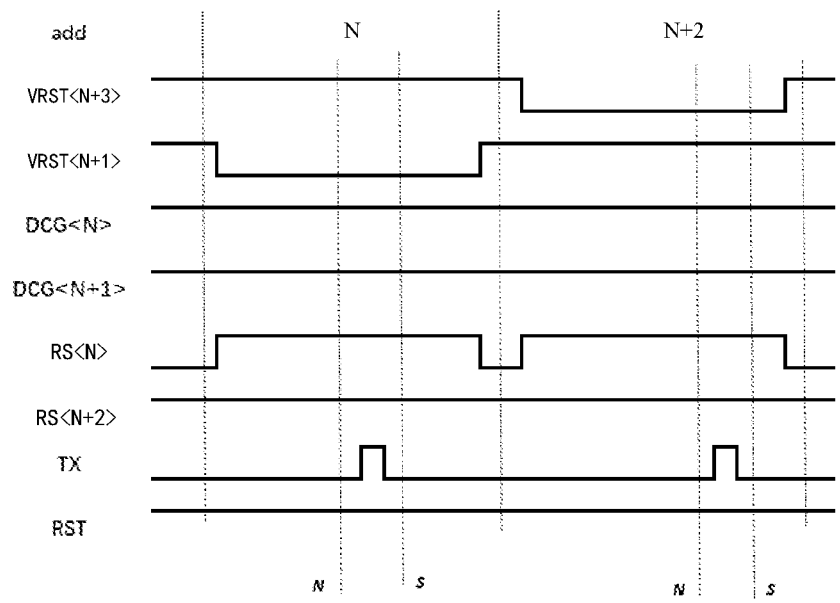
FIG. 20 shows a timing diagram for accelerated readout of the image sensor in FIG. 15 in a TCG mode.

Step 3-3: as shown in the timing of address N in FIG. 19, controlling the reset transistor 120 in the pixel block 100 in the $N^{th}$ row to be turned off (VRST<N+1> is at a low level) and the gain control transistor 130 in the pixel block 100 in the $N^{th}$ row to be turned on (DCG<N> is at a high level), and controlling the gain control transistor 130 in the pixel block 100 in the $(N+1)^{th}$ row to be turned on (DCG<N+1> is at a high level). In a further example, controlling the source follower transistor 140 in the pixel block 100 in the $N^{th}$ row to be turned on (VSFD<N> is at a high level) and the source follower transistor 140 in the pixel block 100 in the $(N+1)^{th}$ row to be turned off (VSFD<N+1> is at a low level) to perform a charge transfer operation on the pixel block 100 in the $N^{th}$ row. The total capacitance used to adjust the gain is the sum of the capacitance of the floating diffuse active area FD corresponding to the pixel block 100 in the $N^{th}$ row, the capacitance of the gain control transistor 130 in the pixel block 100 in the $N^{th}$ row, the capacitance of the gain control transistor 130 in the pixel block 100 in the $(N+1)^{th}$ row, and the capacitance of the floating diffuse active area FD corresponding to the pixel block 100 in the $(N+1)^{th}$ row (i.e., Ctotal=Cfd_n+Cdcg_n+Cdcg_n+1+Cfd_n+1), and the image sensor enters a third gain mode, such as a TCG mode.

In this process, four transmission transistors 111 in the pixel block 100 in the $N^{th}$ row are turned off, and the select transistor 150 is turned on (RS<N> is at a high level). When the image sensor enters the third gain mode and the charge transfer operation is performed, the four transmission transistors 111 in the pixel block 100 in the $N^{th}$ row are controlled to be turned on and then be turned off, and the other transistors remain unchanged.

It should be noted that for the above three control steps, i.e., steps 2-1, 2-2, and 2-3, those skilled in the art can change the order according to the actual demand, and one or two or more of these modes can be selected for control reading according to the actual demand. In an example, no matter what gain mode the image sensor is in, the select transistor 150 in the pixel block 100 in the N$^{th}$ row needs to be turned on when the charge is read out for the pixel block 100 in the N$^{th}$ row, where the pixel block 100 in the N$^{th}$ row shares a reset transistor 120 with the pixel block 100 in an adjacent row. In an example, for the third gain mode, the select transistor 150 in the pixel block 100 in the N$^{th}$ row and the select transistor 150 in the pixel block 100 in the (N+1)$^{th}$ row which share the reset transistor 120 may be turned on simultaneously (RS<N> is at a high level, and RS<N+2> is at a high level) when the charge is read out for the pixel block 100 in the N$^{th}$ row, to increase the readout speed, as shown in the timing of address N in FIG. 20.

Figure 2:
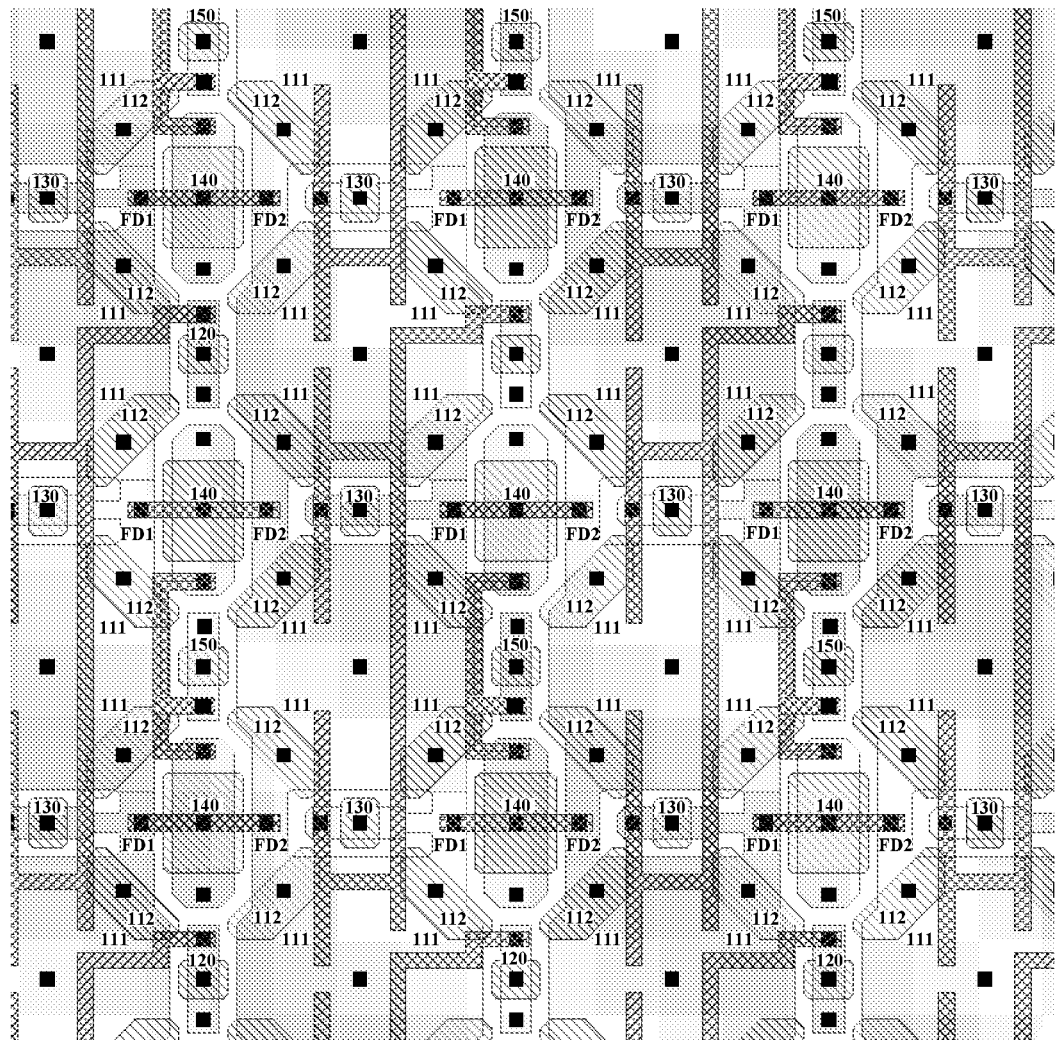
FIG. 2 shows a layout structure of the image sensor in FIG. 1.
Figure 9:
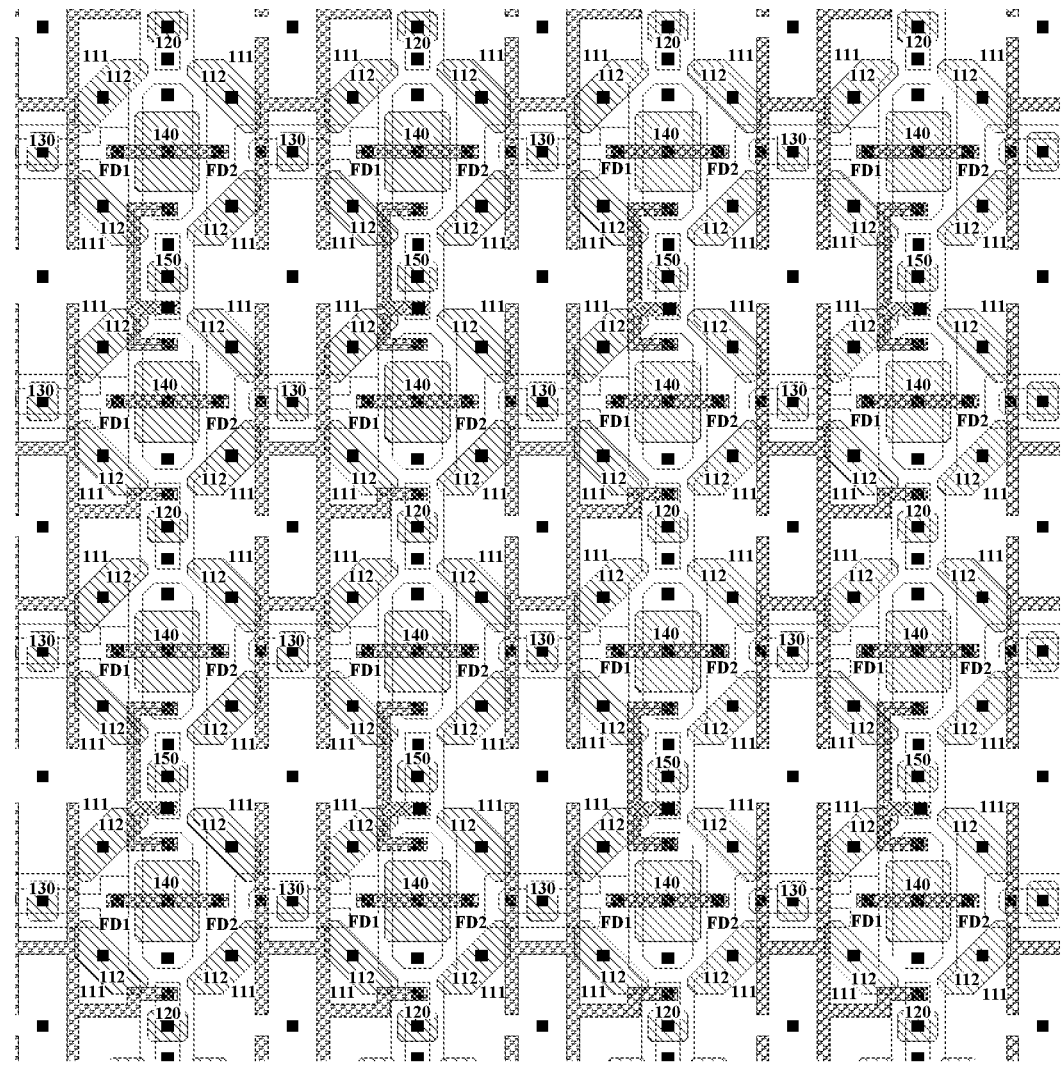
FIG. 9 shows a layout structure of the image sensor in FIG. 8.
Figure 16:
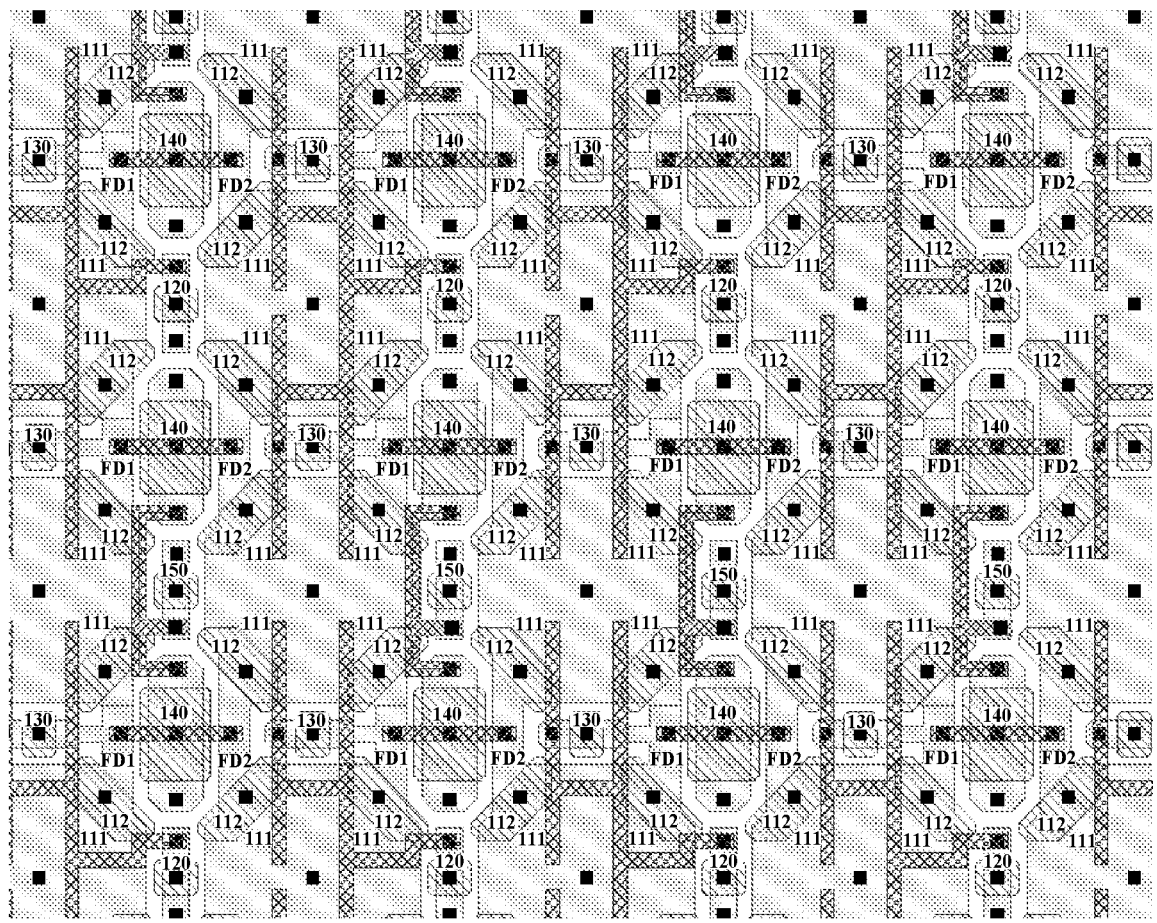
FIG. 16 shows a layout structure of the image sensor in FIG. 15.

As shown in FIGS. 2, 9 and 16, the present disclosure provides a layout structure of an image sensor. The image sensor may be implemented using any circuit structure described above.

The layout structure includes transmission transistors 112 corresponding to the photosensitive elements 111 in the photosensitive unit 110. For example, four transmission transistors 112 may enclose an enclosed area. The source follower transistor 140 is disposed in the enclosed area. The floating diffusion active region FD is disposed in the enclosed area. The floating diffusion active region FD includes a first floating diffusion active area FD1 disposed on one side of the source follower transistor 140 and a second floating diffusion active area FD2 disposed on the other side of the source follower transistor 140. The gain control transistor 130 is disposed outside the enclosed area and on the side where the first floating diffusion active area FD1 is located. The reset transistor 120 and the select transistor 150 are disposed outside the enclosed area, and each of the reset transistor 120 and the select transistor 150 is disposed between adjacent source follower transistors 140.

Specifically, the photosensitive unit 110 includes four photosensitive elements 111 and corresponding four transmission transistors 112. The four photosensitive elements 111 are arranged in an array, each of the four transmission transistors 112 are in a strip shape, and each of the four transmission transistors 112 is disposed at a corner of one of the four photosensitive elements 111, wherein the four corners occupied by the four transmission transistors 112 are adjacent to each other, wherein each of the four transmission transistors 112 extends in a direction that is neither perpendicular nor parallel to edges of the layout structure. The first floating diffusion active area FD1 is formed between two adjacent transmission transistors 112 that are aligned in a vertical direction, and the second floating diffusion active area FD2 is also formed between two adjacent transmission transistors 112 that are aligned in the vertical direction. It should be noted that the four photosensitive elements 111 are isolated from each other, which, although not shown in the corresponding drawings of this embodiment, should be understood by those skilled in the art.

In practice, the tilt angles of the transmission transistors 112 (i.e., the angles at which the transmission transistors 112 extend with respect to edges of the layout) may be the same, or different, or partially the same.

For the consideration of symmetry of the layout structure, the tilt angles of the transmission transistors 112 are set to be the same in some examples. For example, the four transmission transistors 112 may be disposed at the corners of the four photosensitive elements 111 at a tilt angle of 45°, respectively, or at an angle other than 45°.

The source follower transistor 140 is disposed in a central area of the enclosed area and is disposed on a line connecting centers of the first floating diffusion active area FD1 and the second floating diffusion active area FD2 so that the distance between the gate terminal of the source follower transistor 140 and the first floating diffusion active area FD1 and the distance between the gate terminal of the source follower transistor 140 and the second floating diffusion active area FD2 are short.

The gain control transistor 130 is disposed on the extension line of the line connecting centers of the first floating diffusion active area FD1 and the second floating diffusion active area FD2 so that the distance between the source terminal of the gain control transistor 130 and the first floating diffusion active area FD1 is short.

The source follower transistor 140 bisects a line segment connecting the reset transistor 120 and the select transistor 150, and extends in a direction perpendicular to the line segment. In an example, the gain control transistor 130 is disposed on a line that extends in a first direction and passes through the center of the source follower transistor 140, and the reset transistor 120 and the select transistor 150 are disposed on a line that extends in a second direction and passes through the center of the source follower transistor 140, with the first direction being perpendicular to the second direction in this example. In addition, for the case where the reset transistor 120 and the select transistor 150 are shared differently, it is sufficient to change the relevant connecting lines, and the position relationship of the devices in the layout remains unchanged.

In this embodiment, all lines such as connecting lines between devices, power lines, signal lines, etc. are made of metal wires to achieve the line connections as shown in FIG. 1, 8, or 15. These metal wires may be set in the same layer or different layers based on actual needs.

In a further example, in two adjacent pixel blocks 100 sharing the same select transistor 150 and the same reset transistor 120, the select transistor 150 is located between the two adjacent source follower transistors 140 in this shared structure and the reset transistor 120 is located outside the two adjacent source follower transistors 140 (as shown in FIG. 2), thereby enabling fewer metal wires to be interconnected.

Figure 3:
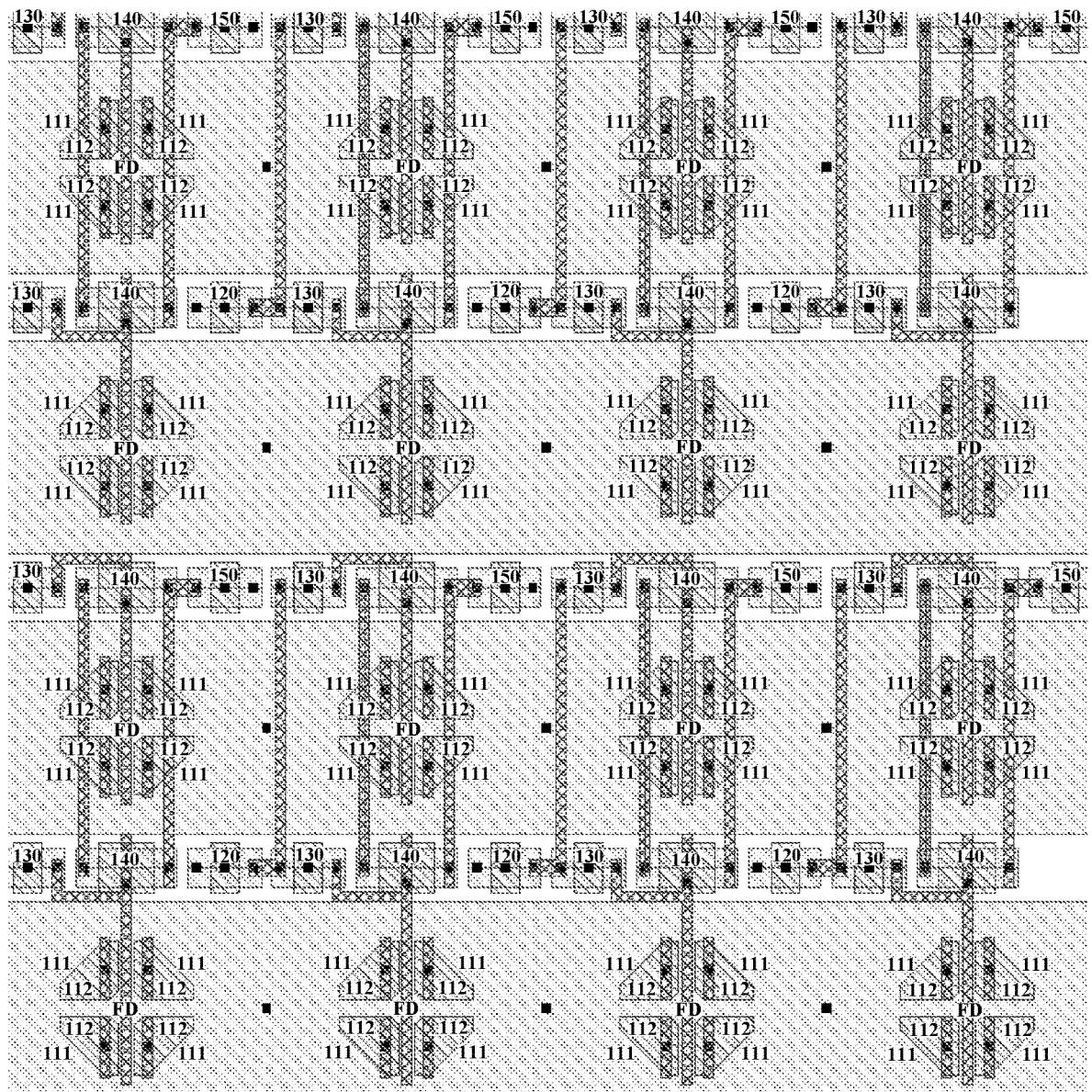
FIG. 3 shows another layout structure of the image sensor in FIG. 1.
Figure 10:
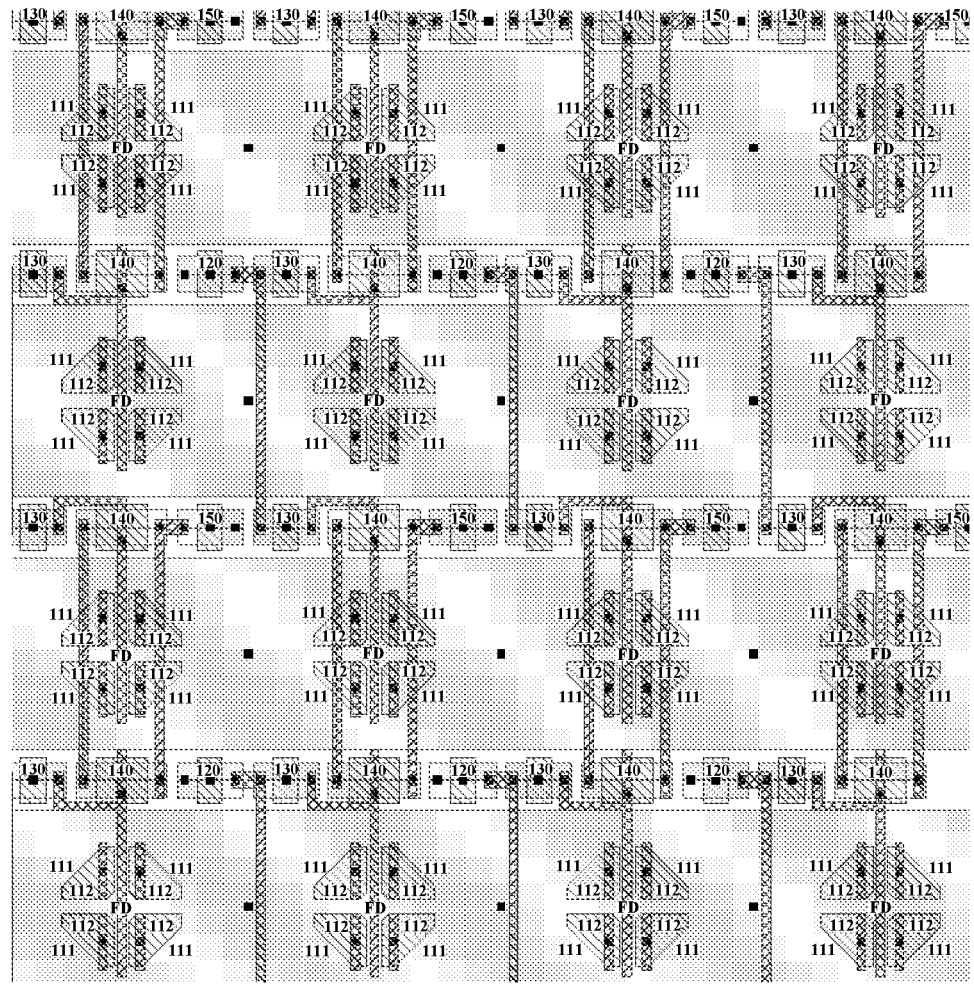
FIG. 10 shows another layout structure of the image sensor in FIG. 8.

As shown in FIGS. 3 and 10, the present disclosure provides another layout structure of the image sensor described above.

The layout structure includes transmission transistors 112 corresponding to the photosensitive elements 111 in the photosensitive unit 110. For example, four transmission transistors 112 may enclose an enclosed area. A floating diffusion active region FD is disposed in the enclosed area. The source follower transistor 140 is disposed outside the enclosed area and on the top of the floating diffusion active region FD. The gain control transistor 130 is disposed outside the enclosed area and on a side of the source follower transistor 140. The reset transistor 120 and the select transistor 150 are disposed outside the enclosed area, on two opposite sides of the enclose area and disposed on two opposite sides of source follower transistors 140 (for example, if the reset transistor 120 is disposed on the left side of one of a first source follower transistors 140, the select transistor 150 is set on the right side of a second source follower transistor 140). A gain control transistor 130 is disposed between the reset transistor 120 and its corresponding source follower transistor 140.

Specifically, the photosensitive unit 110 includes four photosensitive elements 111 and corresponding four transmission transistors 112. The four photosensitive elements 111 are arranged in an array, and the four transmission transistors 112 are disposed at four adjacent corners of the four photosensitive elements 111. The four transmission transistors 112 each have a triangle shape and the four triangular shapes are arranged to substantially form a square, which encloses the enclosed area. It should be noted that the four photosensitive elements 111 are isolated from each other, and although not shown in the corresponding drawings of this embodiment, it should be understood by those skilled in the art.

For the consideration of symmetry of the layout structure, the four transmission transistors 112 each have a right triangle shape, and each two adjacent ones of the four transmission transistors 112 are symmetrically arranged back-to-back. The floating diffusion active region FD is disposed in a center area of the enclosed area, the center of the source follower transistor 140 is located in the same vertical line as the center of the floating diffusion active region FD, the center of the gain control transistor 130 is located in the same horizontal line as the center of the source follower transistor 140, the center of the reset transistor 120 is located in the same horizontal line as the center of its corresponding source follower transistor 140, and the center of the select transistor 150 is located in the same horizontal line as the center of its corresponding source follower transistor 140, so that the distances between the corresponding devices are short.

In summary, the present disclosure provides an image sensor, a layout structure, and a control method. The present disclosure realizes a multi-gain function of the image sensor by making two adjacent pixel blocks share the same reset transistor and/or select transistor. The gain modes of the image sensor include an HCG mode, a DCG mode, and a TCG mode, thereby greatly improving the dynamic range of the image sensor. In addition, the image sensor and its layout design of the present disclosure can achieve multiple gain functions based on fewer transistors, and can address the need for double conversion gain or three conversion gains for shrinking pixels by sharing gain nodes of different rows. The layout structure of the image sensor of the present disclosure is symmetrical, and the interconnecting metal lines are short, which is conducive to improving the image quality captured by the image sensor. Therefore, the present disclosure effectively overcomes various shortcomings in the existing technology and has high industrial utilization value.

The above-mentioned embodiments are just used for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

What is claimed is:

1. An image sensor, comprising:
a plurality of pixel blocks arranged in rows and columns, wherein each of the plurality of pixel blocks comprises:
a floating diffusion active region;
at least one photosensitive unit connected between the floating diffusion active region and a first reference voltage;
a reset transistor, wherein a control terminal of the reset transistor is connected to a reset control signal, and a second terminal of the reset transistor is connected to a reset voltage;
a gain control transistor, wherein a control terminal of the gain control transistor is connected to a gain control signal, a first terminal of the gain control transistor is connected to the floating diffusion active region, and a second terminal of the gain control transistor is connected to a first terminal of the reset transistor;
a source follower transistor, wherein a control terminal of the source follower transistor is connected to the floating diffusion active region, and a second terminal of the source follower transistor is connected to a following voltage; and
a select transistor, wherein a control terminal of the select transistor is connected to a select control signal, a first terminal of the select transistor outputs a pixel signal, and a second terminal of the select transistor is connected to a first terminal of the source follower transistor;
wherein two groups each composed of two adjacent pixel blocks in three adjacent pixel blocks in the same column share the same select transistor and the same reset transistor, respectively, and different pixel blocks comprise different floating diffusion active regions, and different source follower transistors.

2. The image sensor according to claim 1, wherein the plurality of pixel blocks comprises:
wherein the $a^{th}$ pixel block and the $(a+1)^{th}$ pixel block in the same column share the same select transistor, and the $a^{th}$ pixel block and the $(a+1)^{th}$ pixel block in the same column share the same reset transistor; or
wherein the $a^{th}$ pixel block and the $(a+1)^{th}$ pixel block in the same column share the same select transistor, and the $(a+1)^{th}$ pixel block and the $(a+2)^{th}$ pixel block in the same column share the same reset transistor; or
wherein the $a^{th}$ pixel block and the $(a+1)^{th}$ pixel block in the same column share the same reset transistor, and the $(a+1)^{th}$ pixel block and the $(a+2)^{th}$ pixel block in the same column share the same select transistor;
wherein a is an integer greater than or equal to 1.

3. The image sensor according to claim 1, wherein the photosensitive unit comprises:
at least one photosensitive element, wherein a second terminal of the photosensitive element is connected to the first reference voltage; and
at least one transmission transistor, wherein a first terminal of the transmission transistor is connected to a first terminal of the corresponding photosensitive element, a control terminal of the transmission transistor is connected to a transmission control signal, and a second terminal of the transmission transistor is connected to the floating diffusion active region.

4. The image sensor according to claim 3,
wherein each pixel block comprises one said photosensitive unit; and
wherein each said photosensitive unit comprises four said photosensitive elements and four said transmission transistors corresponding to the photosensitive elements.

5. The image sensor according to claim 1, wherein
each of the plurality of pixel blocks further comprises a capacitor, wherein
a first terminal of the capacitor is connected to the second terminal of the gain control transistor; and
a second terminal of the capacitor is connected to a second reference voltage.

6. The image sensor according to claim 1, wherein the first terminals of the select transistors in the same column are connected to the same or different column lines to achieve serial or parallel output of pixel signals.

7. A layout structure of the image sensor according to claim 1, comprising:
a plurality of transmission transistors corresponding to the photosensitive elements in the photosensitive unit, wherein the plurality of transmission transistors encloses an enclosed area,
wherein the floating diffusion active region is disposed in the enclosed area;
wherein the source follower transistor is disposed outside the enclosed area and on a top of the floating diffusion active region;
wherein the gain control transistor is disposed outside the enclosed area and on a side where the source follower transistor is located;
wherein the reset transistor and the select transistor are disposed outside the enclosed area and are arranged on two opposite sides of the enclosed area, and wherein the gain control transistor is arranged between the reset transistor and its corresponding source follower transistor.

8. The layout structure of the image sensor according to claim 7, wherein
the photosensitive unit comprises four photosensitive elements and corresponding four transmission transistors,
wherein the four photosensitive elements are arranged in an array;
wherein the four transmission transistors are respectively disposed at four adjacent corners of the four photosensitive elements; and
wherein the four transmission transistors each have a triangle shape and the four triangular shapes are arranged to form the enclosed area.

9. A control method of the image sensor according to claim 1, comprising:
controlling on and off of gain control transistors in two adjacent pixel blocks to control a capacitance of a charge storage area connected to a corresponding floating diffusion active region, so that the image sensor enters a different gain mode, wherein
the two adjacent pixel blocks are located in the same column and share a same reset transistor.

10. The control method of the image sensor according to claim 9,
wherein the $a^{th}$ pixel block and the $(a+1)^{th}$ pixel block in the same column of the image sensor share the same select transistor, and the $(a+1)^{th}$ pixel block and the $(a+2)^{th}$ pixel block in the same column share the same reset transistor; or
wherein the $a^{th}$ pixel block and the $(a+1)^{th}$ pixel block in the same column share the same reset transistor, and the $(a+1)^{th}$ pixel block and the $(a+2)^{th}$ pixel block in the same column share the same select transistor,
wherein a row in which the first of the two adjacent pixel blocks sharing the reset transistor is located is taken as the $N^{th}$ row, and the control method comprises at least one of the following operations:
controlling a gain control transistor in a pixel block in the $N^{th}$ row to be turned off, such that the image sensor enters a first gain mode;
controlling the reset transistor in the pixel block in the $N^{th}$ row to be turned off and the gain control transistor in the pixel block in the $N^{th}$ row to be turned on, and controlling a gain control transistor in a pixel block in the $(N+1)^{th}$ row to be turned off, such that the image sensor enters a second gain mode; and
controlling the reset transistor in the pixel block in the $N^{th}$ row to be turned off and the gain control transistor in the pixel block in the $N^{th}$ row to be turned on, and controlling the gain control transistor in the pixel block in the $(N+1)^{th}$ row to be turned on, such that the image sensor enters a third gain mode.

11. The control method of the image sensor according to claim 10, further comprising
controlling the reset transistor in the pixel block in the $N^{th}$ row to be turned off and the gain control transistor in the pixel block in the $(N+1)^{th}$ row to be turned on in the first gain mode; and/or
controlling a source follower transistor in the pixel block in the $(N+1)^{th}$ row to be turned off in the second gain mode; and/or
controlling the source follower transistor in the pixel block in the $(N+1)^{th}$ row to be turned off in the third gain mode; and/or
controlling the select transistor in the pixel block in the $N^{th}$ row and the select transistor in the pixel block in the $(N+1)^{th}$ row which share the reset transistor to be turned on when the image sensor enters the third gain mode, to increase a readout speed.

12. The control method of the image sensor according to claim 10, further comprising:
controlling the following voltage of a second terminal of the source follower transistor to be at a high level when the image sensor enters a different gain mode based on the control of a reset voltage.

13. A layout structure of an image sensor, wherein the image sensor comprises:
a plurality of pixel blocks arranged in rows and columns, wherein each of the plurality of pixel blocks comprises:
at least one photosensitive unit connected between a floating diffusion active region and a first reference voltage;
a reset transistor, wherein a control terminal of the reset transistor is connected to a reset control signal, and a second terminal of the reset transistor is connected to a reset voltage;
a gain control transistor, wherein a control terminal of the gain control transistor is connected to a gain control signal, a first terminal of the gain control transistor is connected to the floating diffusion active region, and a second terminal of the gain control transistor is connected to a first terminal of the reset transistor;
a source follower transistor, wherein a control terminal of the source follower transistor is connected to the floating diffusion active region, and a second terminal of the source follower transistor is connected to a following voltage; and
a select transistor, wherein a control terminal of the select transistor is connected to a select control signal, a first terminal of the select transistor outputs a pixel signal, and a second terminal of the select transistor is connected to a first terminal of the source follower transistor;

wherein two adjacent pixel blocks in the same column share the same select transistor and the same reset transistor, or two groups each composed of two adjacent pixel blocks in three adjacent pixel blocks in the same column share the same select transistor and the same reset transistor, respectively;

wherein the layout structure of the image sensor comprises a plurality of transmission transistors corresponding to the photosensitive elements in the photosensitive unit, wherein the plurality of transmission transistors encloses an enclosed area, wherein the source follower transistor is disposed in the enclosed area, wherein the floating diffusion active region is disposed in the enclosed area and includes a first floating diffusion active area disposed on one side of the source follower transistor and a second floating diffusion active area disposed on the other side of the source follower transistor, wherein the gain control transistor is disposed outside the enclosed area and on the side of the first floating diffusion active area, and wherein the reset transistor and the select transistor are disposed outside the enclosed area and are separated by one of the adjacent source follower transistors.

14. The layout structure of the image sensor according to claim 13, wherein
the photosensitive unit comprises four photosensitive elements and corresponding four transmission transistors,
wherein the four photosensitive elements are arranged in an array; and
wherein the four transmission transistors each are in a strip shape and disposed at a corner of one of the four photosensitive elements to enclose the enclosed area.

15. The layout structure of the image sensor according to claim 14,
wherein the first floating diffusion active area is formed between two adjacent transmission transistors that are aligned in a vertical direction, and the second floating diffusion active area is also formed between two adjacent transmission transistors that are aligned in the vertical direction; wherein the source follower transistor is disposed on a line connecting centers of the first floating diffusion active area and the second floating diffusion active area; and/or,
wherein in two adjacent pixel blocks sharing the same select transistor and the same reset transistor, the select transistor is located between the two adjacent source follower transistors and the reset transistor is located outside the two adjacent source follower transistors.

16. An image sensor, comprising:
a plurality of pixel blocks arranged in rows and columns, wherein each of the plurality of pixel blocks comprises:
a floating diffusion active region;
at least one photosensitive unit connected between the floating diffusion active region and a first reference voltage;
a reset transistor, wherein a control terminal of the reset transistor is connected to a reset control signal, and a second terminal of the reset transistor is connected to a reset voltage;
a gain control transistor, wherein a control terminal of the gain control transistor is connected to a gain control signal, a first terminal of the gain control transistor is connected to the floating diffusion active region, and a second terminal of the gain control transistor is connected to a first terminal of the reset transistor;
a source follower transistor, wherein a control terminal of the source follower transistor is connected to the floating diffusion active region, and a second terminal of the source follower transistor is connected to a following voltage; and
a select transistor, wherein a control terminal of the select transistor is connected to a select control signal, a first terminal of the select transistor outputs a pixel signal, and a second terminal of the select transistor is connected to a first terminal of the source follower transistor;
wherein two adjacent pixel blocks in the same column share the same select transistor and the same reset transistor, and different pixel blocks comprise different floating diffusion active regions, and different source follower transistors.

17. The image sensor according to claim 16, wherein the photosensitive unit comprises:
at least one photosensitive element, wherein a second terminal of the photosensitive element is connected to the first reference voltage; and
at least one transmission transistor, wherein a first terminal of the transmission transistor is connected to a first terminal of the corresponding photosensitive element, a control terminal of the transmission transistor is connected to a transmission control signal, and a second terminal of the transmission transistor is connected to the floating diffusion active region.

18. The image sensor according to claim 17,
wherein each pixel block comprises one said photosensitive unit; and
wherein each said photosensitive unit comprises four said photosensitive elements and four said transmission transistors corresponding to the photosensitive elements.

19. The image sensor according to claim 16, wherein
each of the plurality of pixel blocks further comprises a capacitor, wherein
a first terminal of the capacitor is connected to the second terminal of the gain control transistor; and
a second terminal of the capacitor is connected to a second reference voltage.

20. The image sensor according to claim 16, wherein the first terminals of the select transistors in the same column are connected to the same or different column lines to achieve serial or parallel output of pixel signals.

21. A layout structure of the image sensor according to claim 16, comprising:
a plurality of transmission transistors corresponding to the photosensitive elements in the photosensitive unit, wherein the plurality of transmission transistors encloses an enclosed area,
wherein the floating diffusion active region is disposed in the enclosed area;
wherein the source follower transistor is disposed outside the enclosed area and on a top of the floating diffusion active region;
wherein the gain control transistor is disposed outside the enclosed area and on a side where the source follower transistor is located;
wherein the reset transistor and the select transistor are disposed outside the enclosed area and are arranged on two opposite sides of the enclosed area, and wherein the gain control transistor is arranged between the reset transistor and its corresponding source follower transistor.

22. The layout structure of the image sensor according to claim 21, wherein
the photosensitive unit comprises four photosensitive elements and corresponding four transmission transistors,
wherein the four photosensitive elements are arranged in an array;
wherein the four transmission transistors are respectively disposed at four adjacent corners of the four photosensitive elements; and
wherein the four transmission transistors each have a triangle shape and the four triangular shapes are arranged to form the enclosed area.

23. A control method of the image sensor according to claim 16, comprising:
controlling on and off of gain control transistors in two adjacent pixel blocks to control a capacitance of a charge storage area connected to a corresponding floating diffusion active region, so that the image sensor enters a different gain mode, wherein
the two adjacent pixel blocks are located in the same column and share a same reset transistor.

24. The control method of the image sensor according to claim 23, wherein the $a^{th}$ pixel block and the $(a+1)^{th}$ pixel block in the same column of the image sensor share a same select transistor and a same reset transistor, wherein a row in which the $a^{th}$ pixel block is located is taken as the $N^{th}$ row, and the control method includes at least one of the following operations:
controlling a gain control transistor in a pixel block in the $N^{th}$ row to be turned off and a source follower transistor in the pixel block in the $N^{th}$ row to be turned on, and controlling a source follower transistor in a pixel block in the $(N+1)^{th}$ row to be turned off, such that the image sensor enters a first gain mode;
controlling the gain control transistor and the source follower transistor in the pixel block in the $N^{th}$ row to be turned on and the reset transistor in the pixel block in the $N^{th}$ row to be turned off, and controlling the gain control transistor and the source follower transistor in the pixel block in the $(N+1)^{th}$ row to be turned off, such that the image sensor enters a second gain mode; and
controlling the gain control transistor and the source follower transistor in the pixel block in the $N^{th}$ row to be turned on and the reset transistor in the pixel block in the $N^{th}$ row to be turned off, and controlling the gain control transistor in the pixel block in the $(N+1)^{th}$ row to be turned on and the source follower transistor in the pixel block in the $(N+1)^{th}$ row to be turned off, such that the image sensor enters a third gain mode.

25. The control method of the image sensor according to claim 24, further comprising
controlling the gain control transistor in the pixel block in the $(N+1)^{th}$ row to be turned on in the first gain mode; and/or
controlling the reset transistor in the pixel block in the $N^{th}$ row to be turned off in the first gain mode; and/or
controlling the source follower transistor in the pixel block in the $N^{th}$ row and the source follower transistor in the pixel block in the $(N+1)^{th}$ row which share the reset transistor to be turned on when the image sensor enters the third gain mode, to increase a readout speed.

26. The control method of the image sensor according to claim 24, further comprising:
controlling a reset voltage of a second terminal of the reset transistor to be at a high level when the image sensor enters a different gain mode based on the control of the following voltage.

* * * * *